(12) United States Patent
Otsubo et al.

(10) Patent No.: US 12,446,159 B2
(45) Date of Patent: Oct. 14, 2025

(54) ELECTRONIC CIRCUIT MODULE

(71) Applicant: Murata Manufacturing Co., Ltd., Kyoto (JP)

(72) Inventors: Yoshihito Otsubo, Nagaokakyo (JP); Hirofumi Oie, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 192 days.

(21) Appl. No.: 18/515,892

(22) Filed: Nov. 21, 2023

(65) Prior Publication Data

US 2024/0090134 A1  Mar. 14, 2024

Related U.S. Application Data

(63) Continuation of application No. PCT/JP2022/007683, filed on Feb. 24, 2022.

(30) Foreign Application Priority Data

May 26, 2021  (JP) .................. 2021-088627

(51) Int. Cl.
*H05K 1/18* (2006.01)

(52) U.S. Cl.
CPC ..... *H05K 1/181* (2013.01); *H05K 2201/0212* (2013.01); *H05K 2201/0707* (2013.01); *H05K 2201/09472* (2013.01); *H05K 2201/095* (2013.01); *H05K 2201/1006* (2013.01); *H05K 2201/10098* (2013.01); *H05K 2201/10287* (2013.01)

(58) Field of Classification Search
CPC .................................... H05K 1/181
USPC ........................................... 174/260
See application file for complete search history.

(56) References Cited

U.S. PATENT DOCUMENTS

| | | | |
|---|---|---|---|
| 2004/0124516 | A1 | 7/2004 | Nakamura et al. |
| 2006/0238961 | A1 | 10/2006 | Saita et al. |
| 2012/0187551 | A1 | 7/2012 | Kushino et al. |
| 2020/0077510 | A1 | 3/2020 | Darveaux et al. |
| 2020/0204159 | A1* | 6/2020 | Onodera ............. H03H 9/25 |
| 2020/0303346 | A1 | 9/2020 | Tsukiyama et al. |

(Continued)

FOREIGN PATENT DOCUMENTS

| | | |
|---|---|---|
| JP | H11-265975 A | 9/1999 |
| JP | 2004-158595 A | 6/2004 |
| JP | 2006-310800 A | 11/2006 |

(Continued)

OTHER PUBLICATIONS

International Search Report for PCT/JP2022/007683 dated May 17, 2022.

*Primary Examiner* — Stanley Tso
(74) *Attorney, Agent, or Firm* — McDonald Hopkins LLC

(57) ABSTRACT

An electronic circuit module includes: a substrate; a first electronic component mounted on one main surface of the substrate; a substrate electrode provided on the one main surface; a second electronic component supported on a support surface opposite to a surface facing the one main surface of the first electronic component; a conductor provided on the support surface of the first electronic component; a wire connected to the conductor and the substrate electrode; and a component electrode provided on a surface of the second electronic component and electrically connected to the conductor.

20 Claims, 19 Drawing Sheets

(56) References Cited

U.S. PATENT DOCUMENTS

| | | |
|---|---|---|
| 2021/0204395 A1 | 7/2021 | Yamamoto et al. |
| 2022/0173085 A1 | 6/2022 | Otsubo et al. |

FOREIGN PATENT DOCUMENTS

| | | |
|---|---|---|
| JP | 2008-016527 A | 1/2008 |
| JP | 2010-147225 A | 7/2010 |
| JP | 2011-044654 A | 3/2011 |
| JP | 2012-151353 A | 8/2012 |
| JP | 2020-102758 A | 7/2020 |
| JP | 2020-155559 A | 9/2020 |
| WO | 2020/067468 A1 | 4/2020 |
| WO | 2021/039325 A1 | 3/2021 |

\* cited by examiner

ELECTRONIC CIRCUIT MODULE

CROSS REFERENCE TO RELATED APPLICATION

This is a continuation of International Application No. PCT/JP2022/007683 filed on Feb. 24, 2022 which claims priority from Japanese Patent Application No. 2021-088627 filed on May 26, 2021. The contents of these applications are incorporated herein by reference in their entireties.

BACKGROUND OF THE DISCLOSURE

Field of the Disclosure

The present disclosure relates to an electronic circuit module in which an electronic component is mounted on a substrate.

Description of the Related Art

Conventionally, as this type of electronic circuit module, for example, an electronic circuit module described in Patent Document 1 is known. The electronic circuit module described in Patent Document 1 includes a substrate, a first filter element (hereinafter, referred to as a "first electronic component"), and a second filter element (hereinafter, referred to as a "second electronic component"). The second electronic component is supported on a main surface of the substrate via a plurality of pillars. The first electronic component is disposed in a space between the substrate and the second electronic component, and is mounted on the main surface of the substrate.

Patent Document 1: US-A-2020-0077510

BRIEF SUMMARY OF THE DISCLOSURE

In the electronic circuit module described in Patent Document 1, for example, a height of each pillar from the substrate may change due to melting of solder included in each pillar at a time of manufacturing the electronic circuit module. In this case, a position and a posture of the second electronic component may be displaced to cause a malfunction of the electronic circuit module.

Therefore, a possible benefit of the present disclosure is to solve the above problem, and to provide an electronic circuit module in which displacement of the position and the posture of the second electronic component is suppressed.

In order to solve the problem, an electronic circuit module according to the present disclosure includes: a substrate; a first electronic component mounted on one main surface of the substrate; a substrate electrode provided on the one main surface; a second electronic component supported on a support surface opposite to a surface facing the one main surface of the first electronic component; a conductor provided on the support surface of the first electronic component; a wire connected to the conductor and the substrate electrode; and a component electrode provided on a surface of the second electronic component and electrically connected to the conductor.

According to the present disclosure, an electronic circuit module can be provided in which displacement of a position and a posture of a second electronic component is suppressed.

DETAILED DESCRIPTION OF THE DISCLOSURE

Figure 1:
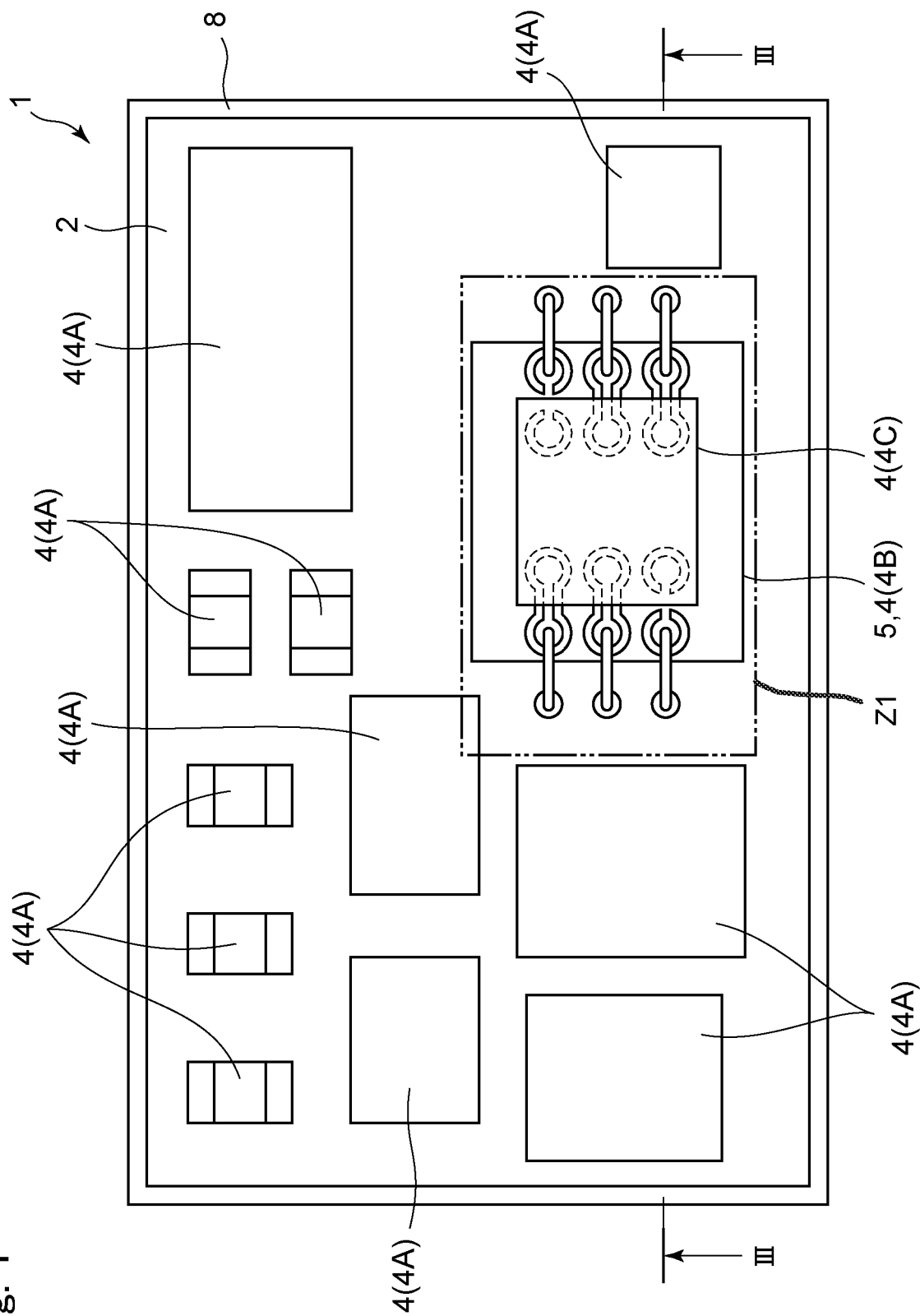
FIG. 1 is a plan view of an electronic circuit module according to a first embodiment of the present disclosure.

An electronic circuit module according to an aspect of the present disclosure includes: a substrate; a first electronic component mounted on one main surface of the substrate; a substrate electrode provided on the one main surface; a second electronic component supported on a support surface opposite to a surface facing the one main surface of the first electronic component; a conductor provided on the support surface of the first electronic component; a wire connected to the conductor and the substrate electrode; and a component electrode provided on a surface of the second electronic component and electrically connected to the conductor.

According to this configuration, the second electronic component is supported on the support surface of the first electronic component. Therefore, the second electronic component is not supported on a pillar provided in a conventional electronic circuit module, and can be disposed farther away from the substrate than the first electronic component in the thickness direction of the substrate, in other words, on the opposite side of the substrate with respect to the first electronic component. Therefore, displacement of a position and a posture of the second electronic component can be suppressed.

In order to electrically connect the conductor and the substrate electrode to each other, wiring extending in a direction intersecting the one main surface of the substrate is required. However, when the conductor and the substrate electrode are connected to each other by a wiring pattern formed on the one main surface of the substrate, it is more difficult to extend the wiring pattern in the above-described direction than to extend the wiring pattern along the one main surface of the substrate. On the other hand, according to the above configuration, the conductor and the substrate electrode are connected to each other by a wire. The wire can be used as wiring extending in the above-described direction. Therefore, electrical connection between the conductor and the substrate electrode can be easily realized.

The second electronic component may be supported on the support surface of the first electronic component via the component electrode. The component electrode may be connected to the conductor.

According to this configuration, an opposing surface of the second electronic component facing the support surface of the first electronic component is away from the support surface of the first electronic component. As a result, a member that needs to be disposed away from the supporting surface of the first electronic component, for example, a wiring pattern constituting at least a part of an electronic circuit can be disposed on the opposing surface of the second electronic component.

The electronic circuit module according to one aspect of the present disclosure may further include a sealing resin provided on the one main surface and covering at least a part of the first electronic component, at least a part of the wire, and a part of the second electronic component.

According to this configuration, the part of the second electronic component is exposed from the sealing resin provided on the one main surface of the substrate. Therefore, heat generated from the second electronic component is easily dissipated through the exposed portion of the second electronic component. As a result, performance degradation due to overheating of the second electronic component can be suppressed. In addition, performance degradation of the first electronic component due to thermal interference of the second electronic component with the first electronic component can be suppressed.

The second electronic component may include an external electrode disposed on a surface opposite to a surface facing the support surface of the first electronic component. At least a part of the external electrode may be exposed from a sealing resin provided on the one main surface.

According to this configuration, at least the part of the external electrode is exposed from the sealing resin provided on the one main surface of the substrate. As a result, the external electrode can be connected to an electrode provided on another substrate (for example, a mother substrate) on which the electronic circuit module is mounted. Therefore, the substrate electrode and the second electronic component can be electrically connected to the electrode provided on the other substrate via the external electrode.

The second electronic component may include an external electrode disposed on a surface opposite to a surface facing the support surface of the first electronic component. A through hole that allows the external electrode to communicate with the outside of the sealing resin provided on the one main surface may be formed in the sealing resin provided on the one main surface.

When the electronic circuit module is mounted on another substrate, the external electrode and an electrode provided on the other substrate can be connected to each other via solder. At this time, when the solder wets and spreads, the external electrode and the electrode provided on the other substrate may be short-circuited with another member. On the other hand, according to the above configuration, by disposing the solder in the through hole and melting the solder, the external electrode can be connected to the electrode provided on the other substrate while suppressing wet-spreading of the solder. Therefore, mounting failure of the electronic circuit module can be suppressed.

The electronic circuit module according to an aspect of the present disclosure may include, an electronic component mounted on the other main surface opposite to the one main surface, a sealing resin provided on the other main surface and covering at least a part of an electronic component mounted on the other main surface, and a shield member covering a surface of the sealing resin provided on the other main surface, the surface being opposite to a surface in contact with the other main surface.

According to this configuration, the electronic component can also be mounted on the other main surface of the substrate. Therefore, the number of electronic components that can be mounted on a fixed area of the substrate increases. Therefore, the size of the substrate can be reduced.

The component electrode may be disposed on a surface of the second electronic component other than a surface facing the support surface of the first electronic component. The wire may include a first wire connected to the conductor and the substrate electrode, and a second wire connected to the conductor and the component electrode.

According to this configuration, the component electrode is disposed on the surface of the second electronic component other than the surface facing the support surface of the first electronic component. As a result, the surface of the second electronic component facing the support surface of the first electronic component can be brought into surface contact with the support surface of the first electronic component or the surface of another member supported on the support surface. Therefore, as compared with a configuration in which the second electronic component is supported on the support surface of the first electronic component via the component electrode, displacement of the position and the posture of the second electronic component with respect to the first electronic component can be suppressed.

The wire and the conductor may be electrically connected to the ground to shield an electromagnetic wave.

According to this configuration, the wire is disposed so as to cover at least a part of the first electronic component, or at least a part of the first electronic component and at least a part of the second electronic component, and is electrically connected to the ground. Therefore, the wire shields an electromagnetic wave radiated from the outside to the electronic component covered with the wire among the first electronic component and the second electronic component. As a result, the electronic component covered with the wire can be suppressed from falling into a malfunction by the electromagnetic wave. The wire also shields an electromagnetic wave radiated from the electronic component covered with the wire. As a result, an influence of the electromagnetic wave radiated from the electronic component covered with the wire can be suppressed from reaching the outside.

According to this configuration, the conductor is electrically connected to the ground. Therefore, the conductor shields the electromagnetic wave radiated from the outside to the first electronic component covered with the conductor. As a result, a malfunction of the first electronic component caused by the electromagnetic wave can be suppressed. The conductor also shields an electromagnetic wave radiated from the first electronic component. As a result, an influence of the electromagnetic wave radiated from the first electronic component can be suppressed from reaching the outside.

The electronic circuit module according to one aspect of the present disclosure may further include a third electronic component disposed at a position between the first electronic component and the substrate electrode on the one main surface when the substrate is viewed from a direction orthogonal to the one main surface. The wire may overlap the third electronic component when the substrate is viewed from the direction orthogonal to the one main surface.

According to this configuration, the wire electrically connected to the ground is disposed so as to cover at least a part of the third electronic component. Therefore, the wire shields the electromagnetic wave radiated from the outside to the third electronic component. As a result, a malfunction of the third electronic component caused by the electromagnetic wave can be suppressed. The wire also shields an electromagnetic wave radiated from the third electronic component. As a result, an influence of the electromagnetic wave radiated from the third electronic component can be suppressed from reaching the outside.

The conductor may overlap at least a part of the second electronic component when viewed from a direction orthogonal to the support surface of the first electronic component.

According to this configuration, the conductor electrically connected to the ground overlaps at least the part of the second electronic component when viewed from the direction orthogonal to the support surface of the first electronic component. Therefore, the conductor shields electromagnetic waves radiated from the first electronic component and the second electronic component to each other. As a result, a malfunction of the first electronic component and the second electronic component caused by the electromagnetic waves can be suppressed.

The first electronic component may constitute at least a part of a transmission circuit.

An electronic component constituting at least a part of the transmission circuit is likely to affect the outside of the electronic component by an electromagnetic wave. On the other hand, according to the above configuration, the electromagnetic wave radiated from the first electronic component constituting at least the part of the transmission circuit is shielded by the wire and the conductor. Therefore, the influence of the electromagnetic wave radiated from the electronic component constituting at least the part of the transmission circuit can be suppressed from reaching the outside.

The first electronic component may be a power amplifier, a surface acoustic wave filter, or a bulk acoustic wave filter.

The second electronic component may constitute at least a part of a transmission circuit. The first electronic component may operate in a higher frequency band than the second electronic component.

At least a part of the support surface of the first electronic component is covered with a conductor electrically connected to the ground. Therefore, an electromagnetic wave radiated from the outside to the support surface of the first electronic component is shielded by the conductor. On the other hand, a member for shielding the electromagnetic wave is not provided on the surface of the second electronic component opposite to the opposing surface. Therefore, a shielding property for the first electronic component is higher than the shielding property for the second electronic component.

As the frequency of the signal handled by the electronic component increases, the influence of the electromagnetic wave radiated from the electronic component easily reaches the outside. That is, among the first electronic component and the second electronic component, the electronic component operating in the higher frequency band is more likely to affect the outside by the electromagnetic wave than the other electronic component.

According to the above configuration, the first electronic component having a high shielding property operates in a higher frequency band than the second electronic component. As a result, the influence of the electromagnetic wave of the electronic component operating in the higher frequency band can be suppressed from reaching the outside.

The second electronic component may constitute at least a part of a reception circuit.

The electronic circuit module according to one aspect of the present disclosure may further include a resin sheet disposed on the support surface of the first electronic component. At least a part of the conductor may be patterned on a surface of the resin sheet opposite to a surface facing the first electronic component.

According to this configuration, a portion of the conductor patterned in the resin sheet is not in contact with the surface of the first electronic component. Therefore, a member that needs to be disposed away from the conductor, for example, a wiring pattern constituting at least a part of the electronic circuit can be disposed on the surface of the first electronic component.

At least the part of the conductor may be in contact with the surface of the first electronic component.

According to this configuration, at least the part of the conductor is in contact with the surface of the first electronic component. Therefore, the heat generated from the first electronic component is easily conducted to the conductor to be dissipated. As a result, performance degradation due to overheating of the first electronic component can be suppressed. In addition, thermal interference of the first electronic component with the second electronic component can be suppressed. Therefore, performance degradation of the second electronic component can be suppressed.

The second electronic component may include a conductive portion electrically connected to the component electrode. The conductive portion may be away from the support surface of the first electronic component.

According to this configuration, the conductive portion electrically connected to the component electrode is away from the support surface of the first electronic component. As a result, the possibility that the conductive portion comes into contact with the support surface of the first electronic component and is damaged can be reduced.

The first electronic component may be connected to the substrate electrode via a conductive member.

According to this configuration, mounting stability of the first electronic component can be secured.

Hereinafter, embodiments of the present disclosure will be described with reference to the drawings. These embodiments do not limit the present disclosure. In the drawings, substantially the same members are denoted by the same reference numerals, and the description thereof will be omitted.

Hereinafter, for convenience of description, terms indicating directions such as "upper layer", "middle layer", "lower layer", "top surface", or "side surface" are used, but these terms do not limit a use state or the like of the electronic circuit module according to the present disclosure.

In the present specification, "A and B are electrically connected to each other" includes all of that an electric signal, power, and the like can be conducted between A and B, that A and B are capacitively coupled to each other, and that A and B are electromagnetically coupled to each other. Therefore, A and B need not be physically connected to each other.

First Embodiment

Figure 2:
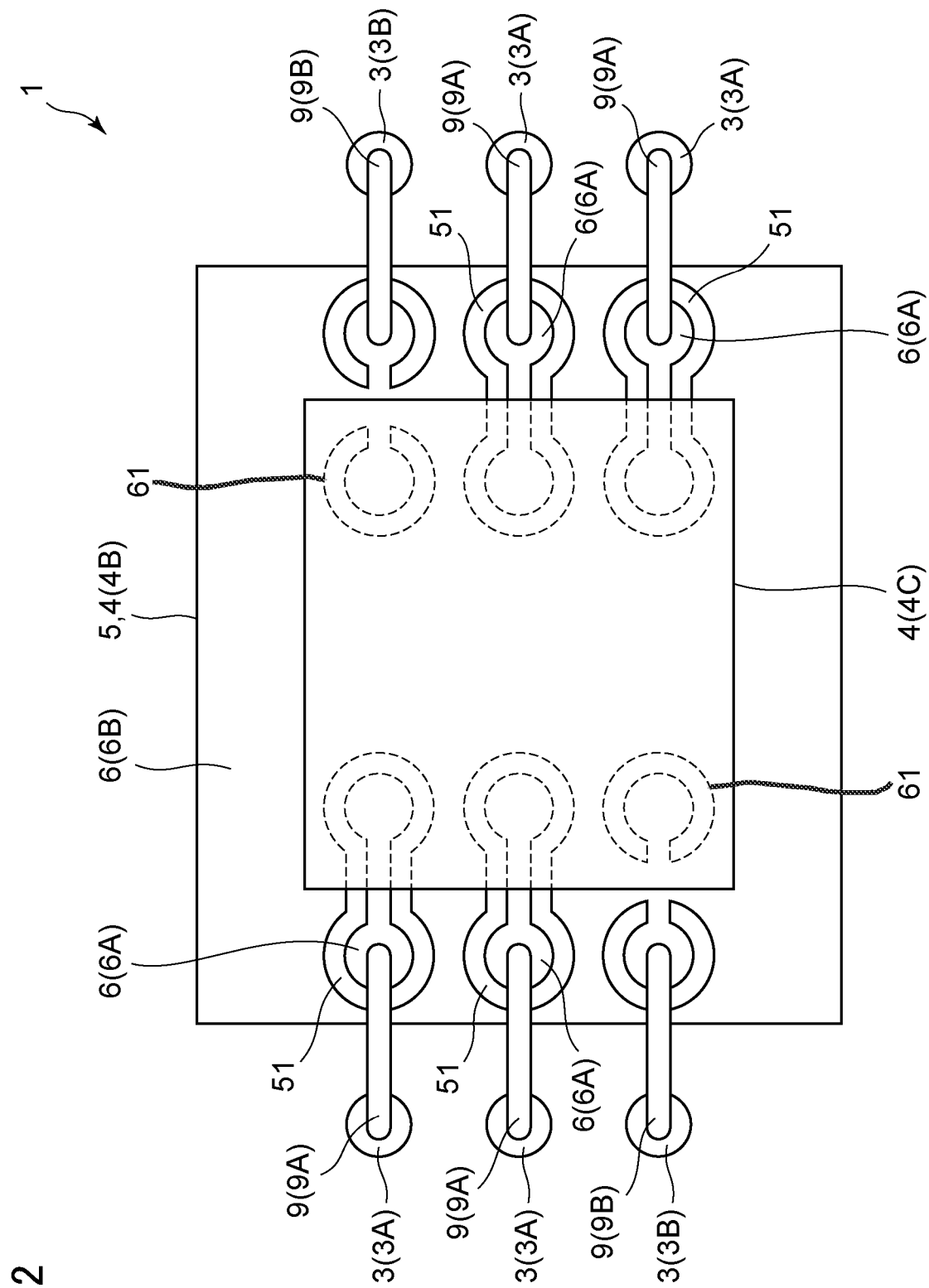
FIG. 2 is an enlarged view of a Z1 portion of the electronic circuit module in FIG. 1.
Figure 3:
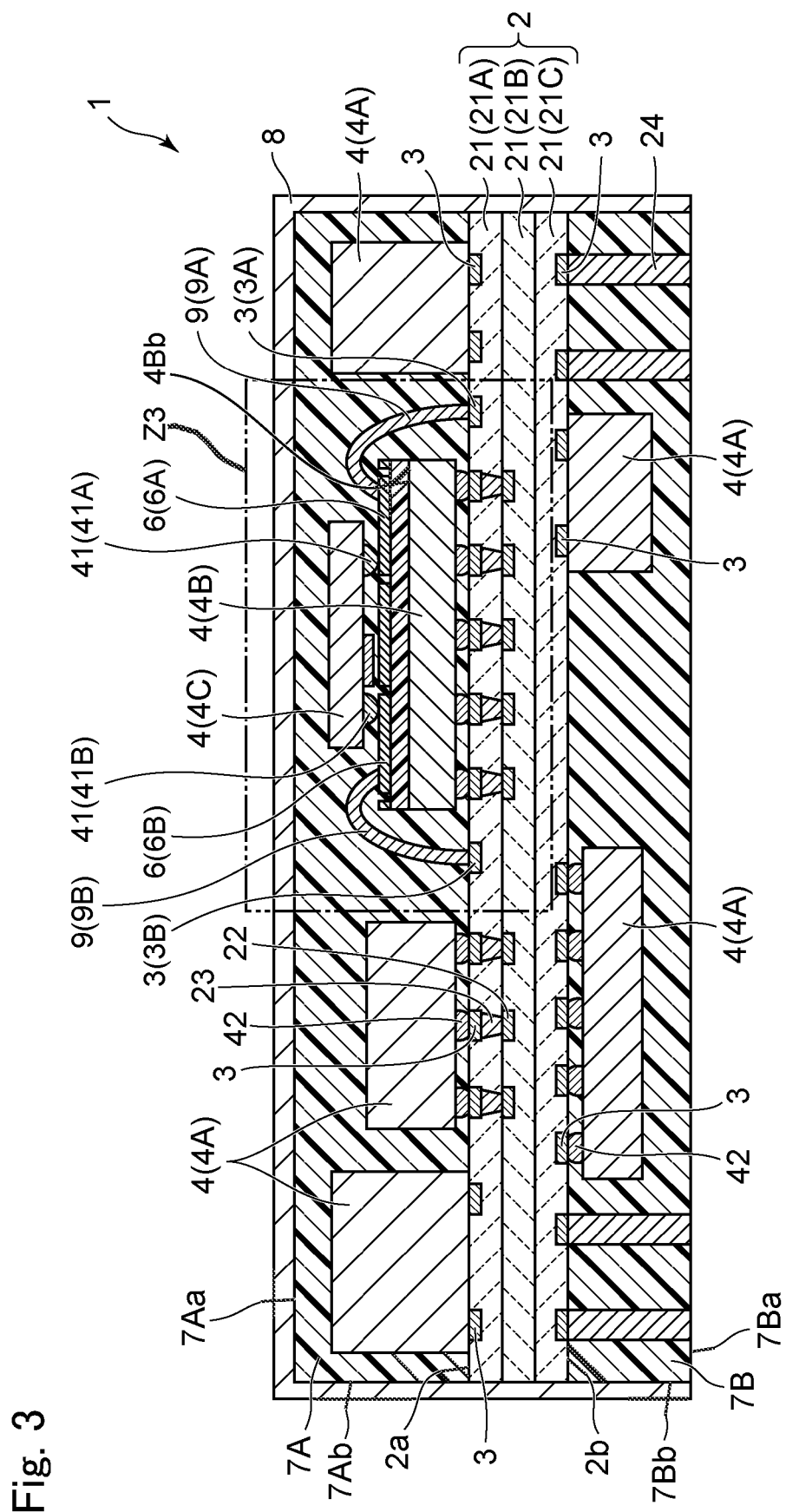
FIG. 3 is a cross-sectional view of the electronic circuit module in FIG. 1 taken along line III-III.
Figure 4:
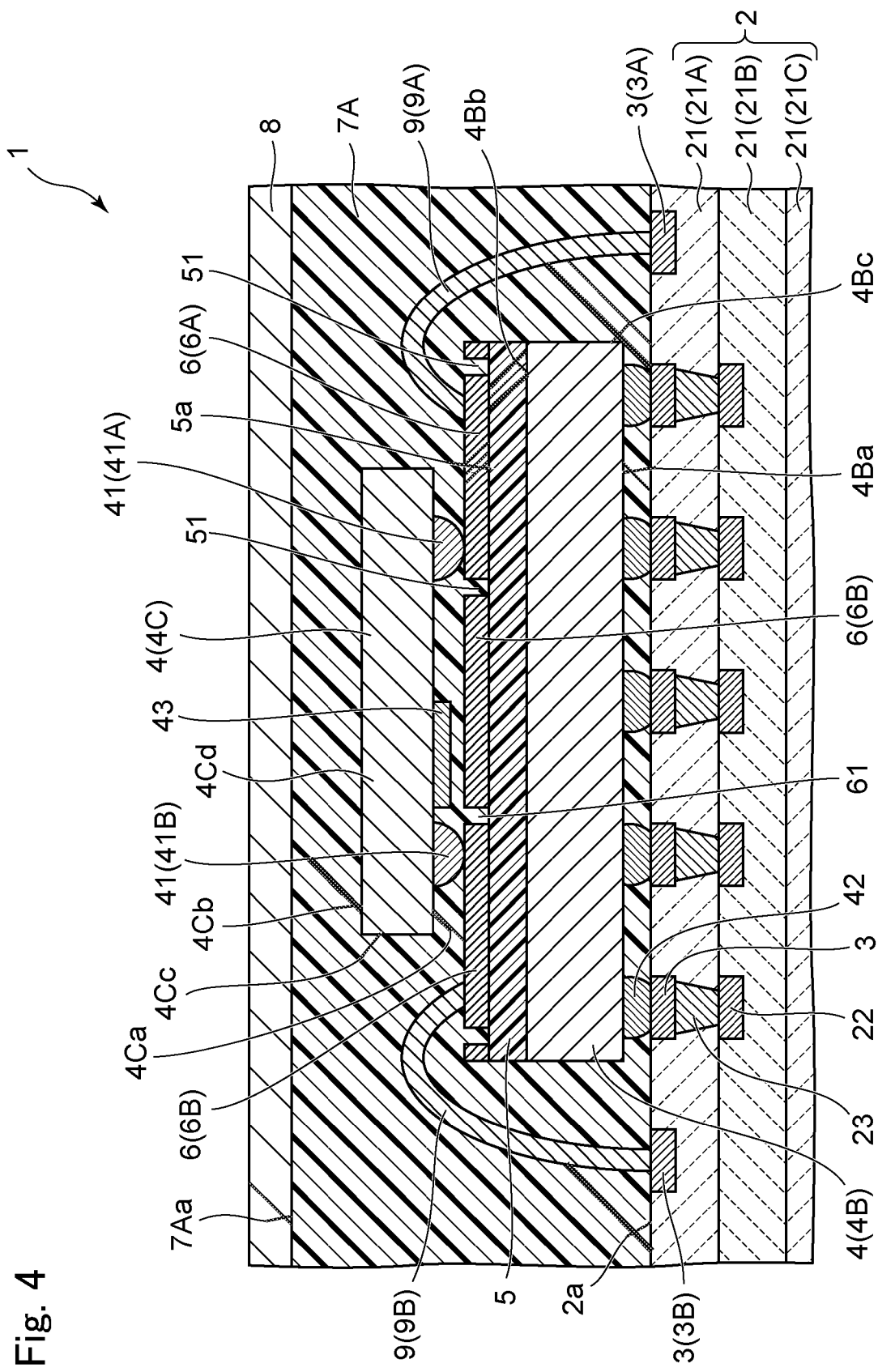
FIG. 4 is an enlarged view of a Z3 portion of the electronic circuit module in FIG. 3.

FIG. 1 is a plan view of an electronic circuit module according to a first embodiment of the present disclosure. FIG. 2 is an enlarged view of a Z1 portion of the electronic circuit module in FIG. 1. FIG. 3 is a cross-sectional view of the electronic circuit module in FIG. 1 taken along line FIG. 4 is an enlarged view of a Z3 portion of the electronic circuit module in FIG. 3. In FIGS. 1 and 2, a sealing resin 7A and a portion of a shield member 8 in contact with a top surface 7Aa of the sealing resin 7A are omitted, the sealing resin 7A and the shield member 8 being described later.

In the first embodiment, as illustrated in FIGS. 1 to 4, the electronic circuit module 1 includes a substrate 2, pad electrodes 3, electronic components 4, component electrodes 41, a resin sheet 5, conductors 6, sealing resins 7A and 7B, the shield member 8, and columnar electrodes 24.

The substrate 2 is a double-sided mounting substrate, and includes a plurality of insulating layers 21 as illustrated in FIG. 3. In the present embodiment, the plurality of insulating layers 21 includes an upper layer 21A, a middle layer 21B, and a lower layer 21C. The middle layer 21B is laminated on the lower layer 21C. The upper layer 21A is laminated on a surface of the middle layer 21B opposite to a surface in contact with the lower layer 21C. A surface of the upper layer 21A opposite to a surface in contact with the middle layer 21B constitutes a main surface 2a of the substrate 2. The main surface 2a is an example of the one main surface in the present disclosure. A surface of the lower layer 21C opposite to a surface in contact with the middle layer 21B constitutes a main surface 2b of the substrate 2. The main surface 2b is an example of the other main surface in the present disclosure.

Each insulating layer 21 is made of, for example, ceramic such as alumina, or resin such as glass epoxy, Teflon (registered trademark), or paper phenol.

The pad electrode 3 is provided on each of the main surfaces 2a and 2b of the substrate 2. The pad electrode 3 is an example of the substrate electrode in the present disclosure. As illustrated in FIG. 4, the pad electrode 3 includes a connection electrode 3A and a ground electrode 3B. As illustrated in FIG. 2, the connection electrode 3A and the ground electrode 3B are disposed outside an electronic component 4B (described later) when the substrate 2 is viewed from a direction orthogonal to the main surface 2a. In the present embodiment, four connection electrodes 3A and two ground electrodes 3B are provided on the main surface 2a of the substrate 2.

The connection electrode 3A is electrically connected to an electronic circuit provided on the substrate 2. At least one of the connection electrodes 3A may be grounded by being electrically connected to an external ground.

The ground electrode 3B is electrically grounded by being electrically connected to the ground. For example, the ground electrode 3B is electrically connected to a grounding portion provided on another substrate (for example, a mother substrate) on which the electronic circuit module 1 is mounted.

When the plurality of insulating layers 21 are made of ceramic, the pad electrode 3 is obtained by co-firing a conductive paste printed on the main surfaces 2a and 2b of the substrate 2 with the plurality of insulating layers 21. In this case, the pad electrode 3 is made of, for example, copper. When the plurality of insulating layers 21 are made of resin, the pad electrode 3 is provided on the main surfaces 2a and 2b of the substrate 2 by a known means such as etching. In this case, the pad electrode 3 is made of, for example, a metal foil.

As illustrated in FIG. 4, internal conductors 22 are provided on a surface of the middle layer 21B in contact with the upper layer 21A. The internal conductor 22 is formed by, for example, the same method as the pad electrode 3. Note that the internal conductor 22 need not be provided on the substrate 2.

Each insulating layer 21 is provided with via conductors 23 penetrating each layer. When the plurality of insulating layers 21 are made of ceramic, the via conductor 23 is obtained by co-firing a conductive paste with which a hole formed in each insulating layer 21 is filled with the plurality of insulating layers 21. In this case, the via conductor 23 is made of, for example, copper. When the plurality of insulating layers 21 is made of resin, the via conductor 23 is a conductive member disposed on an inner surface of the hole formed in each insulating layer 21. In this case, the via conductor 23 is made of, for example, a metal foil. The via conductor 23 need not be provided in each insulating layer 21.

As illustrated in FIGS. 1 and 3, the electronic components 4 include electronic components 4A to 4C. The electronic component 4 is, for example, various electronic components such as an integrated circuit, a resistor, an inductor, or a capacitor. The electronic components 4A are mounted on the main surfaces 2a and 2b of the substrate 2. The electronic component 4B is mounted on the main surface 2a of the substrate 2. The electronic component 4B is an example of the first electronic component in the present disclosure. As illustrated in FIG. 4, the electronic component 4C is supported on a second surface 4Bb (described later) of the electronic component 4B. The electronic component 4C is an example of the second electronic component in the present disclosure.

In the present embodiment, as illustrated in FIGS. 1 and 3, a plurality of the electronic components 4A, one electronic component 4B, and one electronic component 4C are provided. FIG. 3 illustrates five of the plurality of electronic components 4A. In FIG. 3, three electronic components 4A are mounted on the main surface 2a of the substrate 2, and the other two electronic components 4A are mounted on the main surface 2b of the substrate 2.

Each of the electronic components 4A and 4B is electrically connected to the pad electrodes 3. For example, in FIG. 3, one of the electronic components 4A mounted on the main surface 2a of the substrate 2 is connected to three pad electrodes 3 via solder bumps 42, respectively, made of solder. For example, in FIG. 3, two of the electronic components 4A mounted on the main surface 2a of the substrate 2 are in contact with two pad electrodes 3, respectively. Note that connection means between each of the electronic components 4A and 4B and the pad electrode 3 is not limited to the above example, and various known connection means can be adopted.

As illustrated in FIG. 4, the electronic component 4B includes a first surface 4Ba facing the main surface 2a of the substrate 2, the second surface 4Bb opposite to the first surface 4Ba, and a third surface 4Bc connecting an edge of the first surface 4Ba and an edge of the second surface 4Bb to each other. The second surface 4Bb is an example of the support surface in the present disclosure. The first surface 4Ba, the second surface 4Bb, and the third surface 4Bc of the electronic component 4B constitute surfaces of the electronic component 4B.

The electronic components 4B and 4C are, for example, integrated circuits such as a power amplifier or a low noise amplifier. Note that the electronic components 4B and 4C are not limited to the integrated circuit, and may be, for example, a resistor, an inductor, or a capacitor. In the present embodiment, the electronic component 4B constitutes at least a part of the transmission circuit. Examples of the electronic component constituting at least the part of the transmission circuit include a power amplifier, a surface acoustic wave filter, and a bulk acoustic wave filter.

The electronic component 4B is connected to the pad electrode 3 via the solder bump 42. As a result, the electronic component 4B is mounted on the substrate 2. The solder bump 42 is an example of the conductive member in the present disclosure. Note that a material of the conductive member is not limited to solder, and may be, for example, gold, silver, copper, tin, or an alloy including a combination thereof.

The second surface 4Bb of the electronic component 4B is covered with the resin sheet 5. The resin sheet 5 includes an outer surface 5a opposite to a surface facing the electronic component 4B. The resin sheet 5 is made of, for example, a thermoplastic resin sheet such as polyimide or a liquid crystal polymer.

The conductor 6 is provided at the second surface 4Bb of the electronic component 4B. In other words, the conductor 6 is provided on the second surface 4Bb of the electronic component 4B. In the present embodiment, the conductor 6 is patterned on the outer surface 5a of the resin sheet 5. In the present specification and claims, "provided on the second surface 4Bb" includes both that the conductor 6 is indirectly provided on the second surface 4Bb via, for example, the resin sheet 5 as in the present embodiment, and that the conductor 6 comes into contact with the second surface 4Bb (see, for example, FIG. 5). The conductor 6 is made of, for example, copper, silver, aluminum, stainless steel, nickel, gold, or an alloy thereof. In the present embodiment, the conductor 6 is a copper foil. Patterning of the conductor 6 is performed by, for example, known means such as photolithography or etching.

As illustrated in FIGS. 2 and 4, the conductors 6 include connecting portions 6A and a grounding portion 6B. The connecting portion 6A is connected to the connection electrode 3A via a wire 9A to be described later. The grounding portion 6B is connected to the ground electrode 3B via a wire 9B to be described later.

In the present embodiment, as illustrated in FIG. 2, four connecting portions 6A and one grounding portion 6B are provided. In the present embodiment, each connecting portion 6A is connected to one connection electrode 3A via the wire 9A. The grounding portion 6B is connected to the two ground electrodes 3B via the two wires 9B, respectively. The number of the connection electrodes 3A connected to each connecting portion 6A may be two or more. The number of ground electrodes 3B connected to the grounding portion 6B, may be one or three or more.

The connecting portion 6A has a shape in which two circular portions and a linear portion connecting the two circular portions to each other are integrated when the electronic component 4B is viewed from a direction orthogonal to the second surface 4Bb. The wire 9A is connected to one circular portion. A component electrode 41A (see FIG. 4) of the electronic component 4C is connected to the other circular portion. The shape of the connecting portion 6A is not limited to the above shape, and may be, for example, a polygonal shape when the electronic component 4B is viewed from a direction orthogonal to the second surface 4Bb.

As illustrated in FIG. 4, the grounding portion 6B is disposed so as to cover the second surface 4Bb of the electronic component 4B. In the present embodiment, as illustrated in FIG. 2, the grounding portion 6B is patterned in a region of the outer surface 5a of the resin sheet 5 excluding a portion where the connecting portion 6A is patterned and a peripheral portion 51 of the connecting portion 6A. That is, the grounding portion 6B is disposed away from each of the connecting portions 6A with each of the peripheral portions 51 interposed therebetween. In the present embodiment, the area of the grounding portion 6B is larger than each of the area of the connecting portion 6A and the area of the peripheral portion 51 when the electronic component 4B is viewed from the direction orthogonal to the second surface 4Bb.

The grounding portion 6B is connected to the ground electrode 3B via the wire 9B and is grounded. Therefore, the grounding portion 6B can shield an electromagnetic wave radiated from the outside to the electronic component 4B and an electromagnetic wave radiated from the electronic component 4B.

Grooves 61 each having a C-shape are formed in the grounding portion 6B when the electronic component 4B is viewed from a direction orthogonal to the second surface 4Bb. A component electrode 41B (see FIG. 4) of the electronic component 4C is connected to each portion surrounded by the groove 61 of the grounding portion 6B. In the present embodiment, as illustrated in FIG. 4, the groove 61 penetrates the grounding portion 6B. The groove 61 may have a shape other than the C-shape when the electronic component 4B is viewed from the direction orthogonal to the second surface 4Bb. The groove 61 need not penetrate the grounding portion 6B. The groove 61 need not be formed in the grounding portion 6B.

The pad electrode 3 and the conductor 6 are connected to each other via the wire 9. The wires 9 include the wires 9A and 9B. In the present embodiment, as illustrated in FIG. 2, four wires 9A and two wires 9B are provided as the wires 9. The wire 9A connects the connection electrode 3A and the connecting portion 6A to each other. The wire 9B connects the ground electrode 3B and the grounding portion 6B to each other. As illustrated in FIG. 4, the wire 9B is disposed so as to cover a part of the second surface 4Bb and a part of the third surface 4Bc of the electronic component 4B.

The wire 9 is made of, for example, a conductive material such as copper, gold, silver, or aluminum. In the present embodiment, the wire 9 is a bonding wire.

The electronic component 4C is disposed on the second surface 4Bb of the electronic component 4B via the resin sheet 5 and the conductor 6. That is, the electronic component 4C is supported on the second surface 4Bb of the electronic component 4B via the resin sheet 5 and the conductor 6. The electronic component 4C includes a first surface 4Ca facing the second surface 4Bb of the electronic component 4B with the resin sheet 5 and the conductor 6 interposed therebetween, a second surface 4Cb opposite to the first surface 4Ca, and a third surface 4Cc connecting an edge of the first surface 4Ca and an edge of the second surface 4Cb to each other. The first surface 4Ca, the second surface 4Cb, and the third surface 4Cc of the electronic component 4C constitute surfaces, respectively, of the electronic component 4C.

In the present embodiment, the electronic component 4C constitutes at least a part of the transmission circuit, similarly to the electronic component 4B. In the present embodiment, the electronic component 4B operates in a higher frequency band than the electronic component 4C. The electronic component 4B and the electronic component 4C may be the same electronic component or electronic components different from each other.

As illustrated in FIG. 2, the electronic component 4C overlaps the grounding portion 6B when the electronic component 4B is viewed from a direction orthogonal to the second surface 4Bb. A portion of the grounding portion 6B overlapping the electronic component 4C shields electromagnetic waves radiated from the electronic component 4B and the electronic component 4C to each other. Therefore, the electronic component 4C can be disposed close to the electronic component 4B in the thickness direction of the substrate 2. Therefore, the height of the electronic circuit module 1 can be reduced.

As illustrated in FIG. 4, the component electrodes 41 are provided on the first surface 4Ca of the electronic component 4C. The component electrodes 41 include the component electrode 41A and the component electrode 41B. In the present embodiment, four component electrodes 41A and two component electrodes 41B are provided. FIG. 4 illustrates one component electrode 41A and one component electrode 41B among these component electrodes 41A and 41B.

In the present embodiment, the component electrode 41 is a solder bump made of solder. The groove 61 suppresses the solder constituting the component electrode 41B from wet-spreading in the manufacturing process of the electronic circuit module 1. As a result, short-circuit due to the wet-spreading of the solder is less likely to occur, and a malfunction of the electronic circuit module 1 is suppressed.

The component electrode 41A is electrically connected to the connecting portion 6A. As a result, the connection electrode 3A and the component electrode 41A are electrically connected to each other. Therefore, power supply, signal transmission, and the like can be performed between the connection electrode 3A and the component electrode 41A. When the connection electrode 3A is electrically connected to the ground, the component electrode 41A is grounded. In the present embodiment, the component electrode 41A is in contact with the connecting portion 6A.

The component electrode 41B is electrically connected to the grounding portion 6B. As a result, the ground electrode 3B and the component electrode 41B are electrically connected to each other. Therefore, the grounding portion 6B is electrically connected to the ground and is grounded. That is, the grounding portion 6B not only functions as the shield but also functions as the wiring electrically connecting the component electrode 41B to the ground electrode 3B. In the present embodiment, the component electrode 41B is in contact with the grounding portion 6B.

In the present embodiment, the conductor 6 sandwiched between the electronic component 4B and the electronic component 4C is a copper foil, and is thin in the thickness direction of the substrate 2. As a result, the height from the main surface 2a of the substrate 2 to the second surface 4Cb of the electronic component 4C can be reduced. Therefore, the height of the electronic circuit module 1 can be reduced.

The electronic component 4C includes a conductive portion 43 electrically connected to at least one of the component electrodes 41. When the electronic component 4C includes a circuit, the conductive portion 43 may constitute at least a part of the circuit. The conductive portion 43 is, for example, a wiring, a coupling line, or an electrode. The conductive portion 43 may form at least a part of an element.

The conductive portion 43 is away from the second surface 4Bb of the electronic component 4B. In the present embodiment, the conductive portion 43 is disposed in a portion of the first surface 4Ca of the electronic component 4C where the component electrode 41 is not disposed. In other words, in the electronic component 4C, the conductive portion 43 is disposed in a non-contact portion that is not in contact with the second surface 4Bb of the electronic component 4B.

In the present embodiment, as illustrated in FIG. 2, the area of the electronic component 4C is smaller than the area of the electronic component 4B when the electronic component 4B is viewed from the direction orthogonal to the second surface 4Bb.

As illustrated in FIGS. 3 and 4, the sealing resin 7A is provided on the main surface 2a of the substrate 2. In the present embodiment, the sealing resin 7A covers the electronic components 4A, the electronic components 4B and 4C, the conductors 6, and the wires 9 mounted on the main surface 2a of the substrate 2. The sealing resin 7A includes the top surface 7Aa opposite to a contact surface with respect to the main surface 2a of the substrate 2, and a side surface 7Ab connecting an edge of the contact surface and an edge of the top surface 7Aa to each other.

The sealing resin 7A is made of, for example, an epoxy resin. The sealing resin 7A may contain a silica filler and a filler such as alumina or the like.

As illustrated in FIG. 3, the main surface 2b of the substrate 2 is provided with the pad electrodes 3, the electronic components 4A, the columnar electrodes 24, and the sealing resin 7B.

The electronic component 4A is electrically connected to the pad electrodes 3 provided on the main surface 2b of the substrate 2. Various known connection means can be adopted as the connection means between the electronic component 4A and the pad electrodes 3.

One end portion of the columnar electrode 24 is connected to the pad electrode 3 formed on the main surface 2b of the substrate 2.

The sealing resin 7B covers the electronic components 4A and a part of each of the columnar electrodes 24. The sealing resin 7B may cover some of the plurality of electronic components 4A, or may cover a part of each of the electronic components 4A. The sealing resin 7B includes the top surface 7Ba opposite to a contact surface with respect to the main surface 2b of the substrate 2, and a side surface 7Bb connecting an edge of the contact surface and an edge of the top surface 7Ba to each other. The top surface 7Ba and the side surface 7Bb of the sealing resin 7B constitute a surface of the sealing resin 7B.

An end portion opposite to an end portion of each of the columnar electrodes 24 connected to the pad electrode 3 is exposed to the top surface 7Ba of the sealing resin 7B. The exposed end portion of the columnar electrode 24 is connected to an electrode provided on another substrate on which the electronic circuit module 1 is mounted. As a result, the electronic circuit module 1 is mounted on the other substrate.

The shield member 8 is disposed across the top surface 7Aa and the side surface 7Ab of the sealing resin 7A and the side surface 7Bb of the sealing resin 7B. The shield member 8 includes a conductive material and is grounded by being electrically connected to an external ground. As a result, the shield member 8 shields the electromagnetic wave. The shield member 8 is formed by, for example, a sputtering method or a vapor deposition method. In the present embodiment, the shield member 8 is away from the second surface 4Cb of the electronic component 4C.

According to the first embodiment, the electronic component 4C is supported on the second surface 4Bb of the electronic component 4B. Therefore, the electronic component 4C is not supported on a pillar provided in a conventional electronic circuit module, and can be disposed farther away from the substrate 2 than the electronic component 4B in the thickness direction of the substrate 2, in other words, on the opposite side of the substrate 2 with respect to the electronic component 4B. Therefore, displacement of a position and a posture of the electronic component 4C can be suppressed.

In order to electrically connect the conductor 6 and the pad electrode 3 to each other, wiring extending in a direction intersecting the main surface 2a of the substrate 2 is required. However, when the conductor 6 and the pad electrode 3 are connected to each other by the wiring pattern formed on the main surface 2a of the substrate 2, it is more difficult to extend the wiring pattern in the above-described direction than to extend the wiring pattern along the main surface 2a of the substrate 2.

On the other hand, according to the first embodiment, the conductor 6 and the pad electrode 3 are connected to each other by the wire 9. The wire 9 can be used as the wiring extending in the above-described direction. Therefore, the electrical connection between the conductor 6 and the pad electrode 3 can be easily realized.

According to the first embodiment, the first surface 4Ca of the electronic component 4C is away from the second surface 4Bb of the electronic component 4B. As a result, a member that needs to be disposed away from the second surface 4Bb of the electronic component 4B, for example, a wiring pattern constituting at least a part of the electronic circuit can be disposed on the first surface 4Ca of the electronic component 4C.

According to the first embodiment, the wire 9B is disposed so as to cover at least a part of the electronic component 4B, and is electrically connected to the ground. Therefore, the wire 9B shields the electromagnetic wave radiated from the outside to the electronic component 4B. As a result, a malfunction of the electronic component 4B caused by the electromagnetic wave can be suppressed. The wire 9B also shields the electromagnetic wave radiated from the electronic component 4B. As a result, the influence of the electromagnetic wave radiated from the electronic component 4B can be suppressed from reaching the outside.

According to the first embodiment, the grounding portion 6B is electrically connected to the ground. Therefore, the grounding portion 6B shields an electromagnetic wave radiated from the outside to the electronic component 4B covered with the grounding portion 6B. As a result, a malfunction of the electronic component 4B caused by the electromagnetic wave can be suppressed. The grounding portion 6B also shields the electromagnetic wave radiated from the electronic component 4B. As a result, the influence of the electromagnetic wave radiated from the electronic component 4B can be suppressed from reaching the outside.

According to the first embodiment, the grounding portion 6B electrically connected to the ground overlaps at least a part of the electronic component 4C when viewed from a direction orthogonal to the second surface 4Bb of the electronic component 4B. Therefore, the grounding portion 6B shields the electromagnetic waves radiated from the electronic component 4B and the electronic component 4C to each other. As a result, a malfunction of the electronic component 4B and the electronic component 4C caused by the above-described electromagnetic waves can be suppressed.

An electronic component constituting at least a part of the transmission circuit is likely to affect the outside of the electronic component by an electromagnetic wave. On the other hand, according to the first embodiment, the electromagnetic wave radiated from the electronic component 4B constituting at least a part of the transmission circuit is shielded by the wire 9B and the grounding portion 6B. Therefore, the influence of the electromagnetic wave radiated from the electronic component 4B constituting at least the part of the transmission circuit can be suppressed from reaching the outside.

At least a part of the second surface 4Bb of the electronic component 4B is covered with the grounding portion 6B electrically connected to the ground. Therefore, an electromagnetic wave radiated from the outside to the second surface 4Bb of the electronic component 4B is shielded by the grounding portion 6B. On the other hand, a member for shielding an electromagnetic wave is not provided on the second surface 4Cb of the electronic component 4C. Therefore, a shielding property for the electronic component 4B is higher than a shielding property for the electronic component 4C.

As the frequency of the signal handled by the electronic component increases, the influence of the electromagnetic wave radiated from the electronic component easily reaches the outside. That is, among the electronic component 4B and the electronic component 4C, the electronic component operating in the higher frequency band is more likely to affect the outside by the electromagnetic wave than the other electronic component.

According to the first embodiment, the electronic component 4B having a high shielding property operates in a higher frequency band than the electronic component 4C. As a result, the influence of the electromagnetic wave of the electronic component 4B operating in the higher frequency band can be suppressed from reaching the outside.

According to the first embodiment, a portion of the conductor 6 patterned in the resin sheet 5 is not in contact with the surface of the electronic component 4B. Therefore, a member that needs to be disposed away from the conductor 6, for example, a wiring pattern constituting at least a part of the electronic circuit can be disposed on the surface of the electronic component 4B.

According to the first embodiment, the conductive portion 43 electrically connected to the component electrode 41 is away from the second surface 4Bb of the electronic component 4B. As a result, the possibility that the conductive portion 43 comes into contact with the second surface 4Bb of the electronic component 4B and is damaged can be reduced.

According to the first embodiment, the electronic component 4B is connected to the pad electrode 3 via the solder bump 42, and thus mounting stability of the electronic component 4B can be secured.

Variation of First Embodiment

Figure 5:
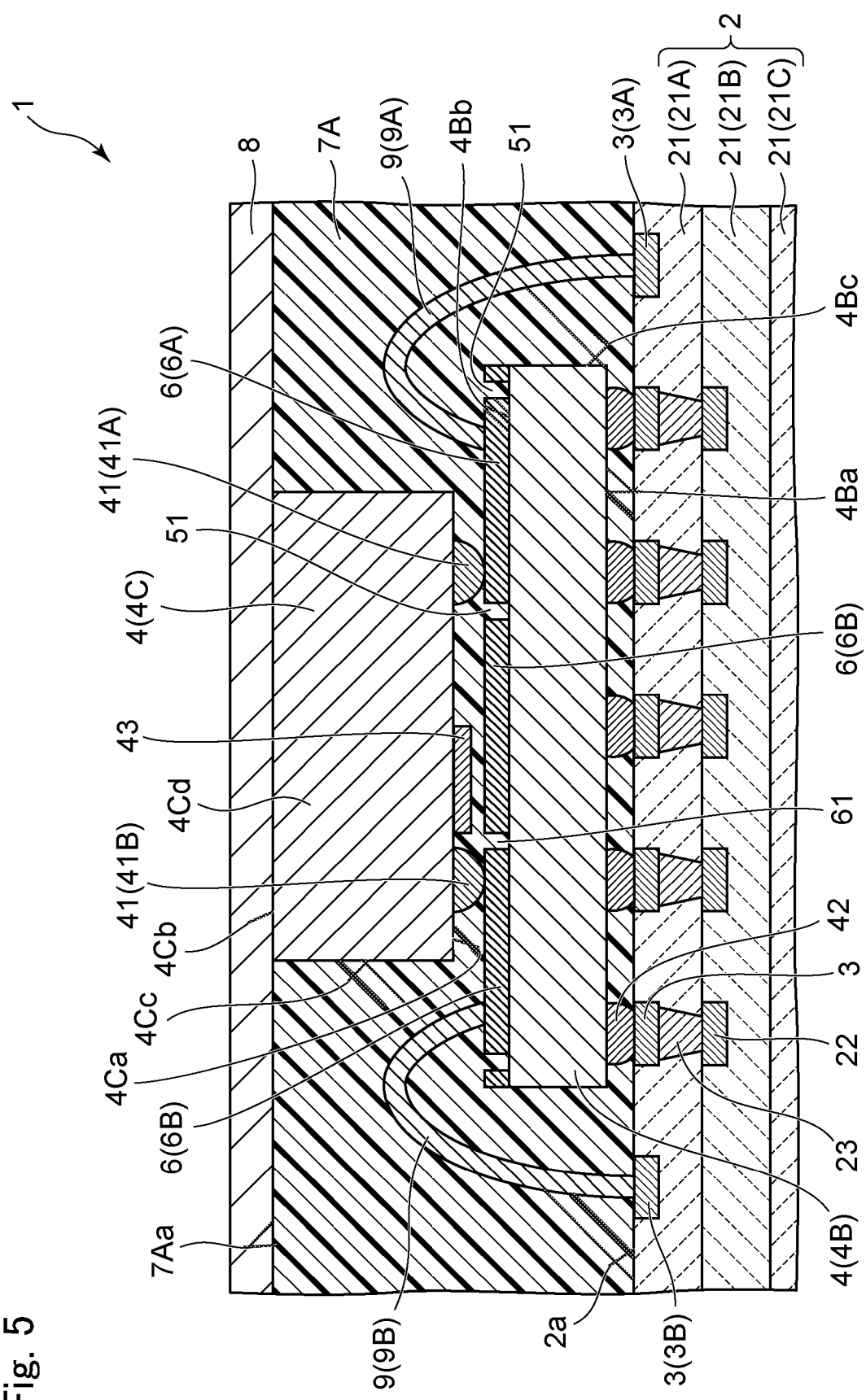
FIG. 5 is an enlarged view corresponding to the Z3 portion in FIG. 3 of a variation of the electronic circuit module according to the first embodiment of the present disclosure.

FIG. 5 is an enlarged view corresponding to the Z3 portion in FIG. 3 of a variation of the electronic circuit module according to the first embodiment of the present disclosure.

In the variation of the electronic circuit module 1 illustrated in FIG. 5, the resin sheet 5 is not provided. Therefore, the conductor 6 is in contact with the second surface 4Bb of the electronic component 4B.

The second surface 4Cb of the electronic component 4C is in contact with a surface of the shield member 8 facing the electronic component 4C. An electrode (not illustrated) may be formed on the second surface 4Cb of the electronic component 4C. The electronic component 4C may be electrically connected to the shield member 8 via the electrode and may be grounded.

According to the variation of the first embodiment, the conductor 6 is in contact with the second surface 4Bb of the electronic component 4B. Therefore, the heat generated from the electronic component 4B is easily conducted to the conductor 6 to be dissipated. As a result, performance degradation due to overheating of the electronic component 4B can be suppressed. In addition, thermal interference of the electronic component 4B with the electronic component 4C can be suppressed. Therefore, performance degradation of the electronic component 4C can be suppressed.

Second Embodiment

Figure 6:
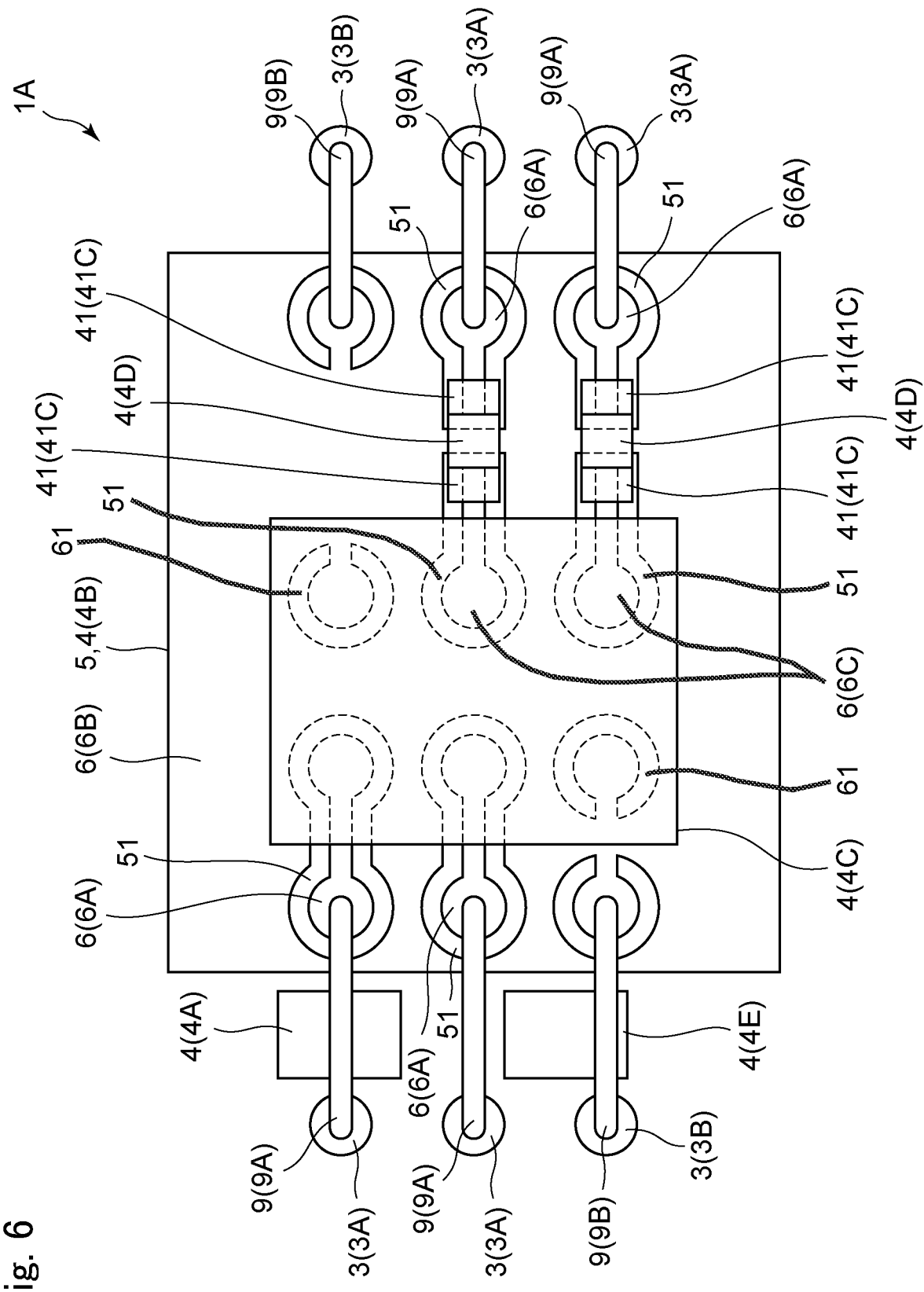
FIG. 6 is an enlarged view corresponding to the Z1 portion in FIG. 1 of an electronic circuit module according to a second embodiment of the present disclosure.
Figure 7:
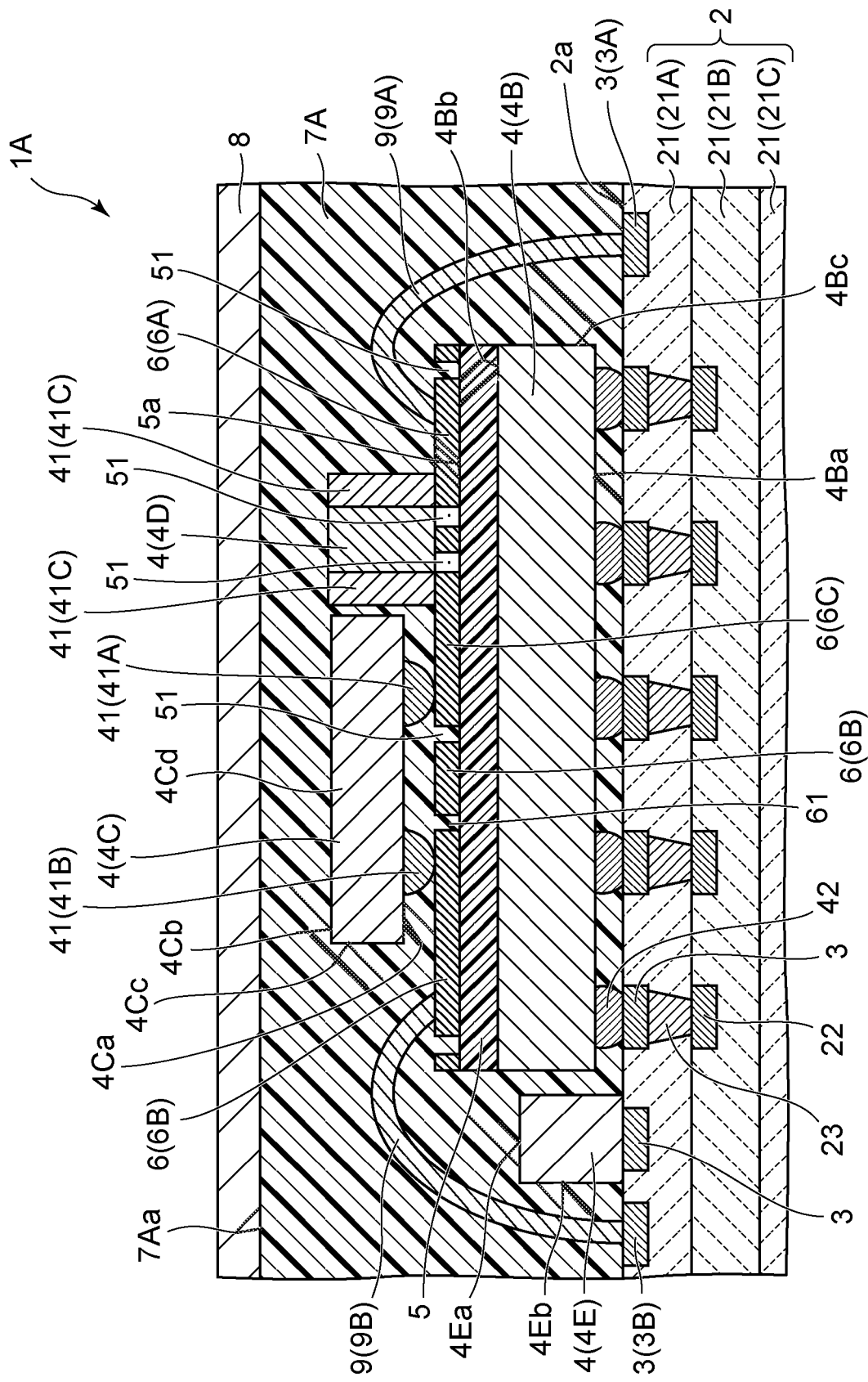
FIG. 7 is an enlarged view corresponding to the Z3 portion in FIG. 3 of the electronic circuit module according to the second embodiment of the present disclosure.

FIG. 6 is an enlarged view corresponding to the Z1 portion in FIG. 1 of an electronic circuit module according to a second embodiment of the present disclosure. FIG. 7 is an enlarged view corresponding to the Z3 portion in FIG. 3 of the electronic circuit module according to the second embodiment of the present disclosure. In FIG. 6 the sealing resin 7A and a portion of the shield member 8 in contact with the top surface 7Aa of the sealing resin 7A are omitted. In FIG. 7, the conductive portion 43 is omitted.

An electronic circuit module 1A according to the second embodiment is different from the electronic circuit module 1 according to the first embodiment in that a plurality of the electronic components 4 are supported on the second surface 4Bb of the electronic component 4B. In addition, an electronic component 4E is mounted on the main surface 2a of the substrate 2.

A portion of the electronic circuit module 1A not illustrated in FIGS. 6 and 7, that is, a portion of the electronic circuit module 1A excluding a portion corresponding to the Z1 portion in FIG. 1 and a portion corresponding to the Z3 portion in FIG. 3 has the same configuration as the electronic circuit module 1.

As illustrated in FIGS. 6 and 7, in the second embodiment, the electronic components 4 include electronic components 4D and 4E in addition to the electronic components 4A to 4C. The electronic components 4C and 4D are examples of the second electronic component in the present disclosure. The electronic component 4E is an example of the third electronic component in the present disclosure.

In the present embodiment, the electronic component 4B constitutes at least a part of the transmission circuit. The electronic component 4C constitutes at least a part of the reception circuit. Examples of the electronic component constituting at least the part of the reception circuit include a low noise amplifier, a surface acoustic wave filter, and a bulk acoustic wave filter. The electronic components 4D and 4E constitute at least a part of an impedance matching circuit. Examples of the electronic component constituting at least the part of the impedance matching circuit include an inductor and a capacitor.

As illustrated in FIG. 7, the electronic components 4C and 4D are supported on the second surface 4Bb of the electronic component 4B via the resin sheet 5 and the conductor 6. The electronic component 4E is mounted on the main surface 2a of the substrate 2. As illustrated in FIG. 6, the electronic component 4E is disposed between the electronic component 4B and the ground electrode 3B when the substrate 2 is viewed from a direction orthogonal to the main surface 2a.

In the present embodiment, the plurality of electronic components 4A, one electronic component 4B (see FIG. 7), one electronic component 4C (see FIG. 7), two electronic components 4D (see FIG. 6), and one electronic component 4E (see FIG. 6) are provided. FIG. 6 illustrates one of the plurality of electronic components 4A mounted on the main surface 2a of the substrate 2.

The pad electrodes 3 include the connection electrode 3A and the ground electrode 3B. In the present embodiment, as illustrated in FIG. 6, four connection electrodes 3A and two ground electrodes 3B are provided on the main surface 2a of the substrate 2.

The conductors 6 include a connecting portion 6C in addition to the connecting portion 6A and the grounding portion 6B. The connecting portion 6C electrically connects the electronic components 4 supported on the second surface 4Bb of the electronic component 4B to each other. In the present embodiment, as illustrated in FIG. 7, the connecting portion 6C is connected to each of the component electrode 41A provided on the electronic component 4C and a component electrode 41C provided on the electronic component 4D.

In the present embodiment, as illustrated in FIG. 6, four connecting portions 6A, one grounding portion 6B, and two connecting portions 6C are provided. Two ground electrodes 3B are connected to one grounding portion 6B via two wires 9B, respectively. In the present embodiment, the grounding portion 6B is patterned in a region of the outer surface 5a of the resin sheet 5 excluding a portion where the connecting portions 6A and 6C are patterned and the peripheral portions 51 of the connecting portions 6A and 6C.

The wires 9 include the wires 9A and 9B. In the present embodiment, four wires 9A and two wires 9B are provided.

The component electrodes 41A and 41B are provided on the first surface 4Ca of the electronic component 4C. In the present embodiment, four component electrodes 41A and two component electrodes 41B are provided. FIG. 7 illustrates one component electrode 41A and one component electrode 41B among these component electrodes 41A and 41B. Two of the four component electrodes 41A are in contact with the connecting portions 6A, respectively. the other two of the four component electrodes 41A are in contact with the connecting portions 6C respectively. Each of the two component electrodes 41B is in contact with the grounding portion 6B.

The electronic component 4D includes both end portions in a direction parallel to the second surface 4Bb of the electronic component 4B. The component electrodes 41C are provided at the both end portions of the electronic component 4D, respectively. In each electronic component 4D, one component electrode 41C is electrically connected to the connecting portion 6A. As a result, the connection electrode 3A, the connecting portion 6A, and the component electrode 41C are electrically connected to each other. The other component electrode 41C is electrically connected to the connecting portion 6C. As a result, the component electrode 41C provided on the electronic component 4D is connected to the component electrode 41A provided on the electronic component 4C via the connecting portion 6C. In the present embodiment, each component electrode 41C is in contact with a respective one of the connecting portions 6A and 6C.

As illustrated in FIG. 7, the electronic component 4E includes an opposing surface facing the main surface 2a of the substrate 2, a first surface 4Ea opposite to the opposing surface, and a second surface 4Eb connecting an edge of the opposing surface and an edge of the first surface 4Ea. A part of the first surface 4Ea and a part of the second surface 4Eb of the surface of the electronic component 4E are covered with the wire 9B.

According to the second embodiment, the wire 9B electrically connected to the ground is disposed so as to cover at least a part of the electronic component 4E. Therefore, the wire 9B shields an electromagnetic wave radiated from the outside to the electronic component 4E. As a result, a malfunction of the electronic component 4E caused by the electromagnetic wave can be suppressed. The wire 9B also shields an electromagnetic wave radiated from the electronic component 4E. As a result, the influence of the electromagnetic wave radiated from the electronic component 4E can be suppressed from reaching the outside.

Third Embodiment

Figure 8:
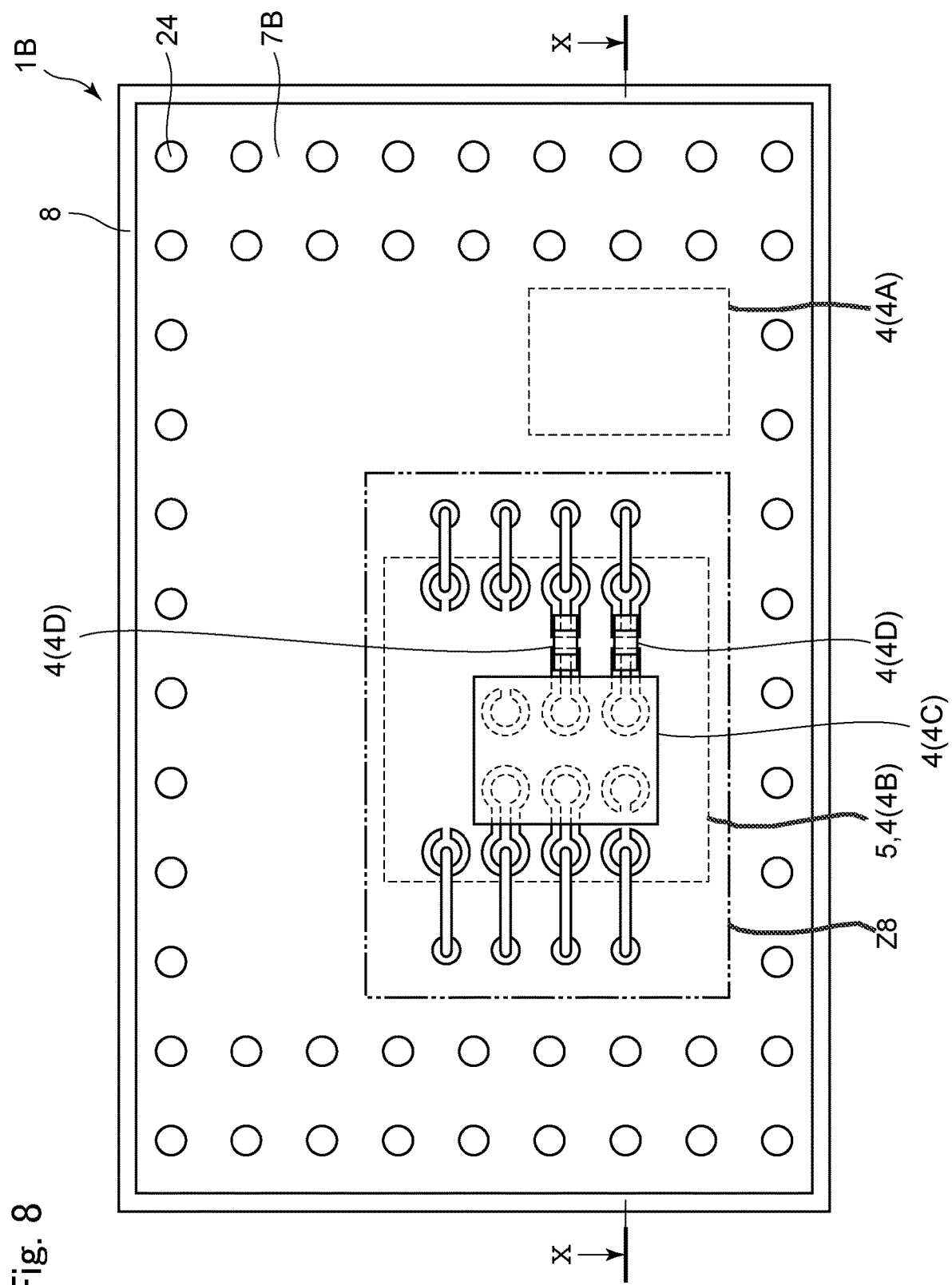
FIG. 8 is a bottom view of an electronic circuit module according to a third embodiment of the present disclosure.
Figure 9:
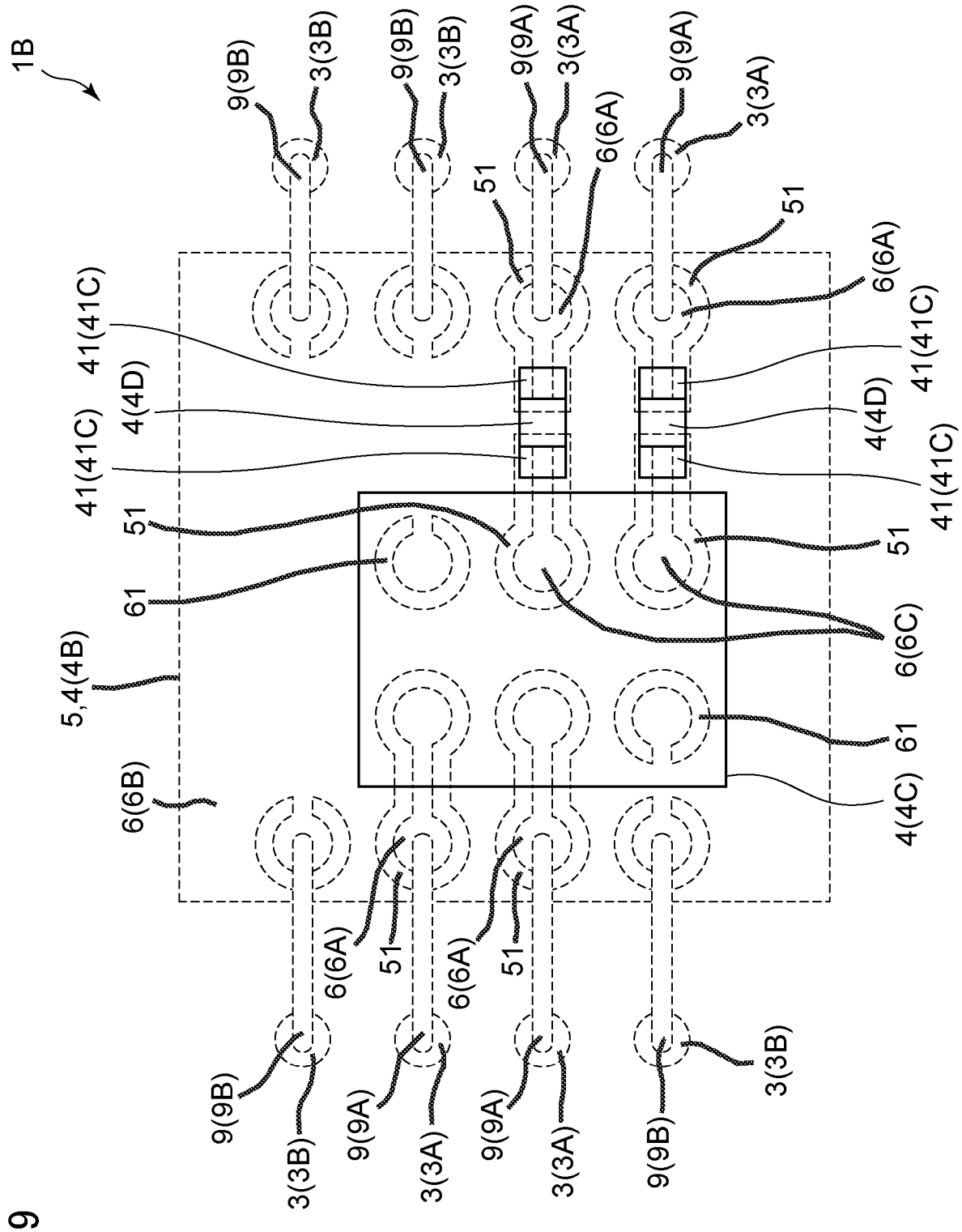
FIG. 9 is an enlarged view of a Z8 portion of the electronic circuit module in FIG. 8.
Figure 10:
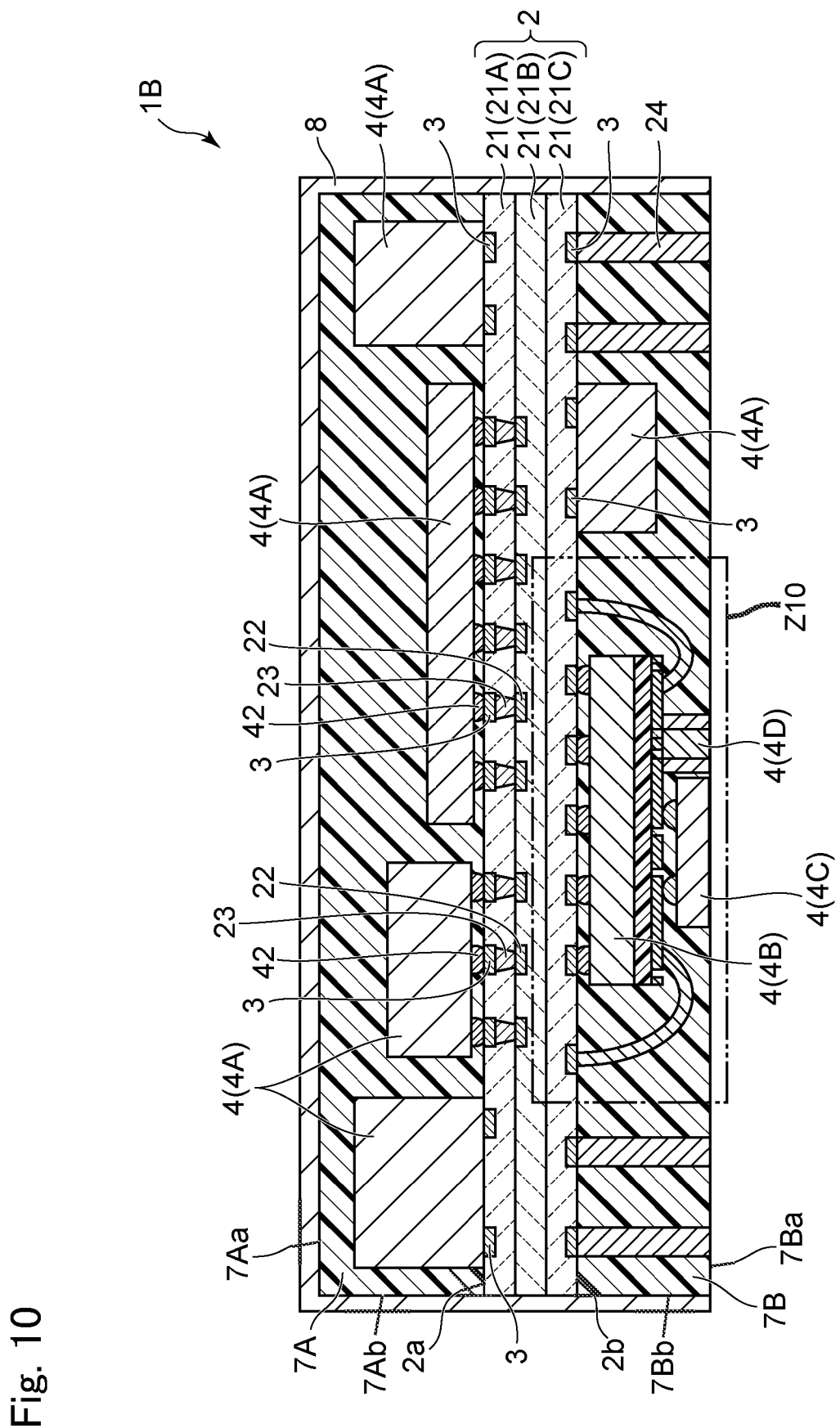
FIG. 10 is a cross-sectional view of the electronic circuit module in FIG. 8 taken along line X-X.
Figure 11:
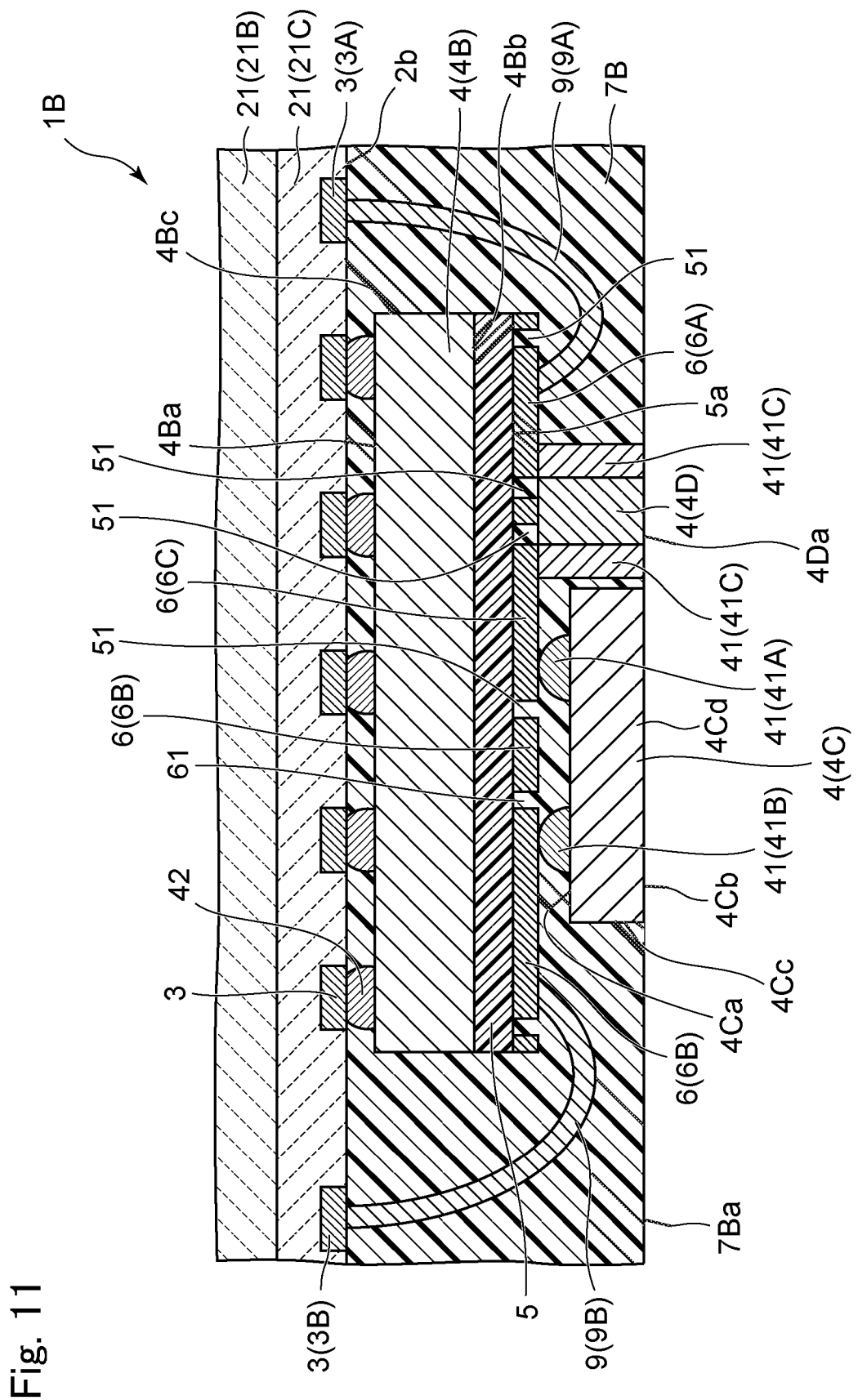
FIG. 11 is an enlarged view of a Z10 portion of the electronic circuit module in FIG. 10.

FIG. 8 is a bottom view of an electronic circuit module according to a third embodiment of the present disclosure. FIG. 9 is an enlarged view of a Z8 portion of the electronic circuit module in FIG. 8. FIG. 10 is a cross-sectional view of the electronic circuit module in FIG. 8 taken along line X-X. FIG. 11 is an enlarged view of a Z10 portion of the electronic circuit module in FIG. 10. In FIGS. 10 and 11, the conductive portion 43 is omitted.

An electronic circuit module 1B according to the third embodiment is different from the electronic circuit module 1A according to the second embodiment in that the electronic component 4B is mounted on the main surface 2b of the substrate 2. Each part of the electronic components 4C and 4D is exposed from the sealing resin 7B.

In the third embodiment, the main surface 2b of the substrate 2 corresponds to the one main surface in the present disclosure. The main surface 2a of the substrate 2 corresponds to the other main surface in the present disclosure.

The electronic component 4 includes the electronic components 4A to 4D. In the present embodiment, as illustrated in FIG. 10, the plurality of electronic components 4A, one electronic component 4B, one electronic component 4C, and one electronic component 4D are provided. FIG. 10 illustrates five of the plurality of electronic components 4A. In FIG. 10, four electronic components 4A are mounted on the main surface 2a of the substrate 2, and one electronic component 4A is mounted on the main surface 2b of the substrate 2.

As illustrated in FIGS. 10 and 11, the electronic component 4B is mounted on the main surface 2b of the substrate 2. In the present embodiment, the electronic components 4B and 4C constitute at least a part of the transmission circuit. The electronic component 4B operates in a higher frequency band than the electronic component 4C.

As illustrated in FIG. 11, the electronic component 4D includes a first surface 4Da opposite to a surface facing the second surface 4Bb of the electronic component 4B.

The pad electrodes 3 include the connection electrode 3A and the ground electrode 3B. In the present embodiment, as illustrated in FIG. 9, four connection electrodes 3A and four ground electrodes 3B are provided on the main surface 2b of the substrate 2. As illustrated in FIG. 11, the wire 9A is connected to the connection electrode 3A. The wire 9B is connected to the ground electrode 3B.

The conductors 6 include the connecting portions 6A and 6C and the grounding portion 6B. In the present embodiment, as illustrated in FIG. 9, four connecting portions 6A, one grounding portion 6B, and two connecting portions 6C are provided. Four ground electrodes 3B are connected to one grounding portion 6B via four wires 9B, respectively. In the present embodiment, the grounding portion 6B is patterned in a region of the outer surface 5a of the resin sheet 5 excluding a portion where the connecting portions 6A and 6C are patterned and the peripheral portions 51 of the connecting portions 6A and 6C.

The wires 9 include the wires 9A and 9B. In the present embodiment, four wires 9A and four wires 9B are provided.

As illustrated in FIG. 11, the component electrodes 41A and 41B are provided on the first surface 4Ca of the electronic component 4C. In the present embodiment, four component electrodes 41A and two component electrodes 41B are provided on the first surface 4Ca of the electronic component 4C. FIG. 11 illustrates one component electrode 41A and one component electrode 41B among these component electrodes 41A and 41B. Each component electrode 41A and each component electrode 41B are connected to a respective one of the conductors 6 as in the second embodiment.

The component electrodes 41C are provided at the both end portions of the electronic component 4D as in the second embodiment, respectively. The component electrode 41C is an example of the component electrode and the external electrode in the present disclosure. In each electronic component 4D, one component electrode 41C is electrically connected to the connecting portion 6A. The other component electrode 41C is electrically connected to the connecting portion 6C. In the present embodiment, each component electrode 41C is in contact with a respective one of the connecting portions 6A and 6C.

As illustrated in FIGS. 10 and 11, the sealing resin 7B provided on the main surface 2b of the substrate 2 covers a part of each of the electronic component 4A, the electronic component 4B, the wire 9, and the electronic components 4C and 4D, a part of the component electrode 41C, and a part of each of the columnar electrodes 24, provided on the main surface 2b of the substrate 2. The second surface 4Cb of the electronic component 4C, the first surface 4Da of the electronic component 4D, and the part of the component electrode 41C are exposed from the sealing resin 7B.

In the present embodiment, as illustrated in FIG. 8, 52 columnar electrodes 24 are provided. Note that the number of the columnar electrodes 24 is not limited to 52. The columnar electrode 24 need not be provided on the main surface 2b of the substrate 2.

As illustrated in FIG. 10, the plurality of electronic components 4A are mounted on the main surface 2a of the substrate 2. On the main surface 2a of the substrate 2, the plurality of electronic components 4A are sealed by the sealing resin 7A.

The shield member 8 is configured similarly to the electronic circuit module 1 according to the first embodiment. That is, the top surface 7Aa of the sealing resin 7A is covered with the shield member 8.

According to the third embodiment, a part of each of the electronic components 4C and 4D is exposed from the sealing resin 7B. Therefore, heat generated from each of the electronic components 4C and 4D is easily dissipated through the exposed portion of a respective one of the electronic components 4C and 4D. As a result, performance degradation due to overheating of the electronic components 4C and 4D can be suppressed. In addition, performance degradation of the electronic component 4B due to thermal interference of the electronic components 4C and 4D with the electronic component 4B can be suppressed.

According to the third embodiment, the part of the component electrode 41C is exposed from the sealing resin 7B. As a result, the component electrode 41C can be connected to an electrode provided on the other substrate on which the electronic circuit module 1B is mounted. Therefore, the connection electrode 3A and the electronic components 4C and 4D can be electrically connected to the electrode provided on the other substrate via the component electrode 41C. For example, power supply, signal transmission, and the like can be performed from the electrode provided on the other substrate to the connection electrode 3A and the electronic components 4C and 4D. When the electrode provided on the other substrate is electrically connected to the ground, the connection electrode 3A and the electronic components 4C and 4D can be grounded.

According to the third embodiment, the electronic component 4 can also be mounted on the main surface 2a of the substrate 2. Therefore, the number of electronic components 4 that can be mounted on a fixed area of the substrate 2 increases. Therefore, the size of the substrate 2 can be reduced.

Fourth Embodiment

Figure 12:
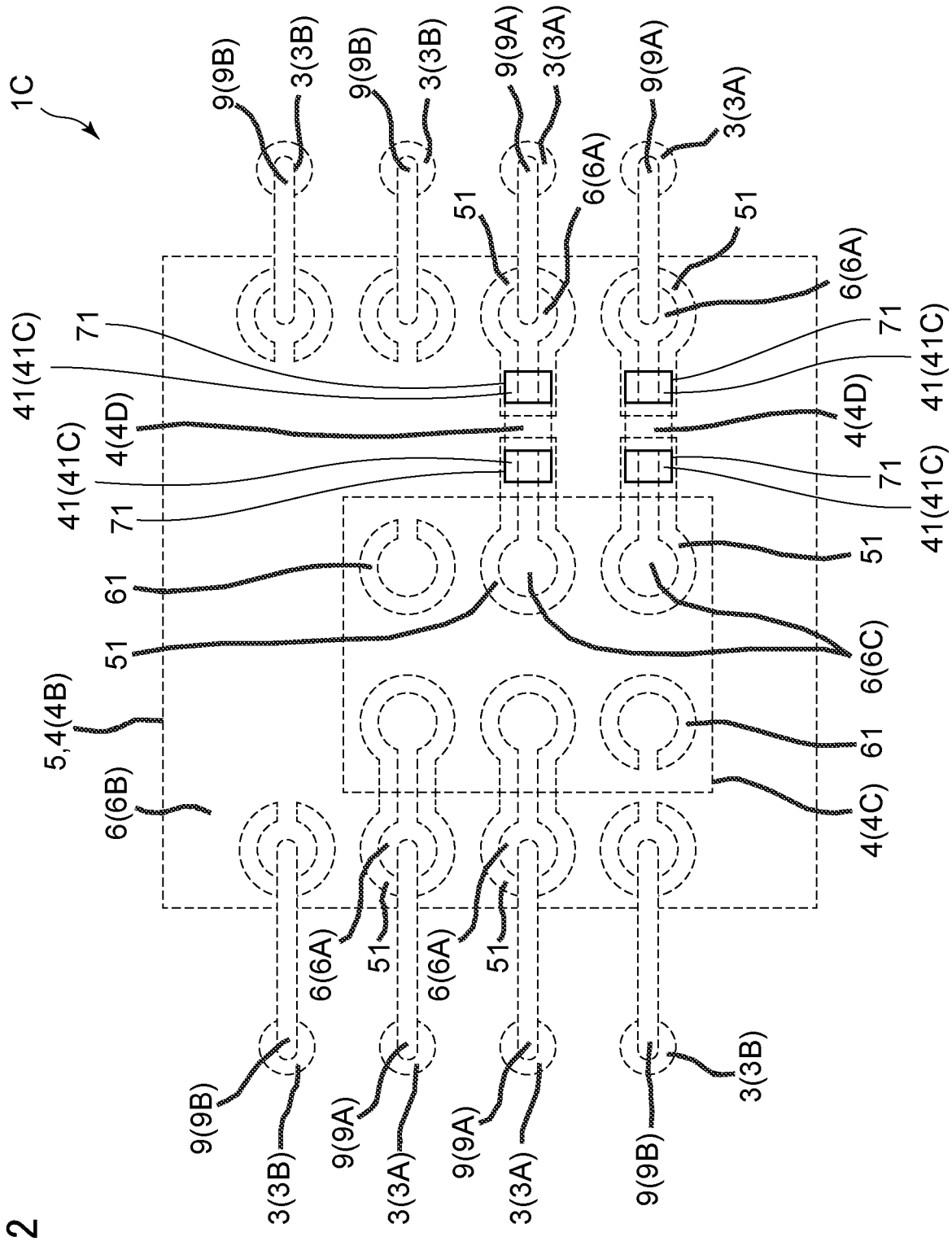
FIG. 12 is an enlarged view corresponding to the Z8 portion in FIG. 8 of an electronic circuit module according to a fourth embodiment of the present disclosure.
Figure 13:
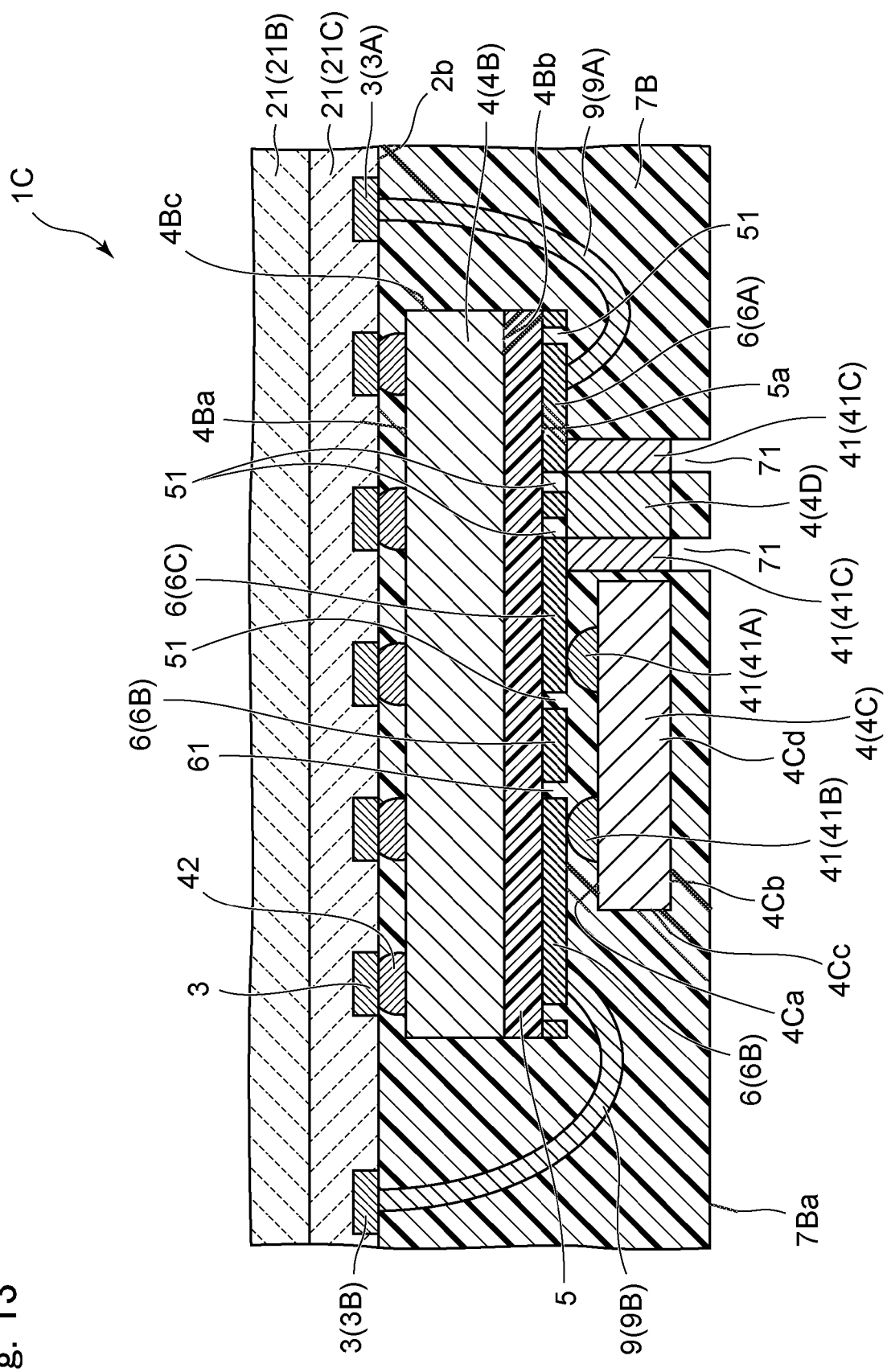
FIG. 13 is an enlarged view corresponding to the Z10 portion in FIG. 10 of the electronic circuit module according to the fourth embodiment of the present disclosure.

FIG. 12 is an enlarged view corresponding to the Z8 portion in FIG. 8 of an electronic circuit module according to a fourth embodiment of the present disclosure. FIG. 13 is an enlarged view corresponding to the Z10 portion in FIG. 10 of the electronic circuit module according to the fourth embodiment of the present disclosure. In FIG. 13, the conductive portion 43 is omitted.

An electronic circuit module 1C according to the fourth embodiment is different from the electronic circuit module 1B according to the third embodiment in that a through hole 71 that allows the component electrode 41C to communicate with the outside of the sealing resin 7B is formed in the sealing resin 7B.

As illustrated in FIG. 13, the sealing resin 7B provided on the main surface 2b of the substrate 2 covers a part of each of the electronic component 4A, the electronic component 4B, the wire 9, and the electronic components 4C and 4D, a part of the component electrode 41C, and a part of each of the columnar electrodes 24, provided on the main surface 2b of the substrate 2.

The through hole 71 opened to the top surface 7Ba of the sealing resin 7B is formed in the sealing resin 7B. In the present embodiment, as illustrated in FIG. 12, four through holes 71 penetrate. The number of through holes 71 may be one. The through hole 71 is formed at a position overlapping the component electrode 41C when the electronic component 4B is viewed from a direction orthogonal to the second surface 4Bb.

As illustrated in FIG. 13, the through hole 71 allows a part of the component electrode 41C to communicate with the outside of the sealing resin 7B. In the present embodiment, the surface of the component electrode 41C constitutes the bottom surface of the through hole 71.

When the electronic circuit module 1C is mounted on the other substrate, the component electrode 41C and the electrode provided on the other substrate can be connected to each other via solder. At this time, when the solder wets and spreads, the component electrode 41C and the electrode provided on the other substrate may be short-circuited with another member. On the other hand, according to the fourth embodiment, by disposing the solder in the through hole 71 and melting the solder, the component electrode 41C can be connected to the electrode provided on the other substrate while suppressing wet-spreading of the solder. Therefore, mounting failure of the electronic circuit module 1C can be suppressed.

Fifth Embodiment

Figure 14:
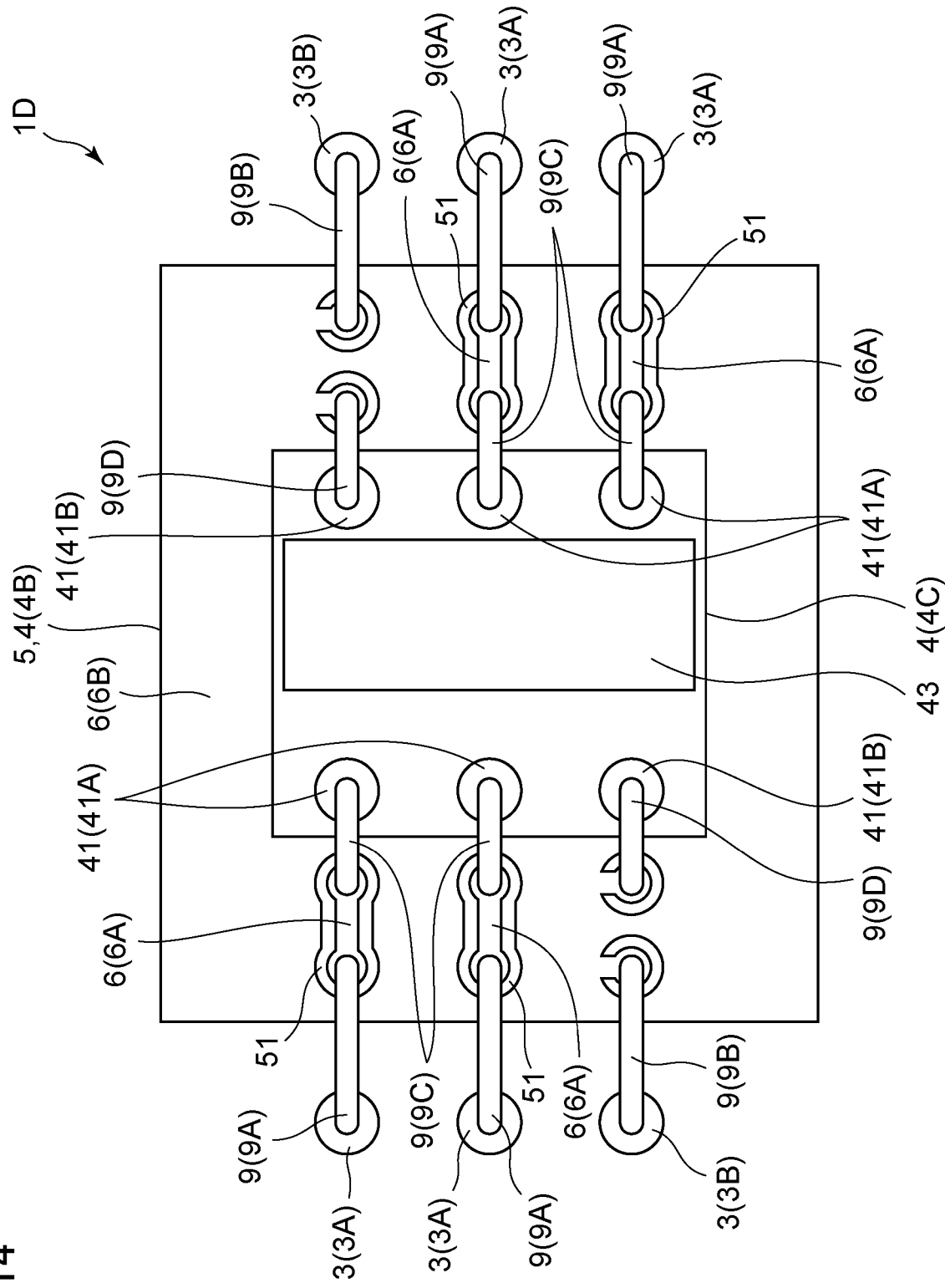
FIG. 14 is an enlarged view corresponding to the Z1 portion in FIG. 1 of an electronic circuit module according to a fifth embodiment of the present disclosure.
Figure 15:
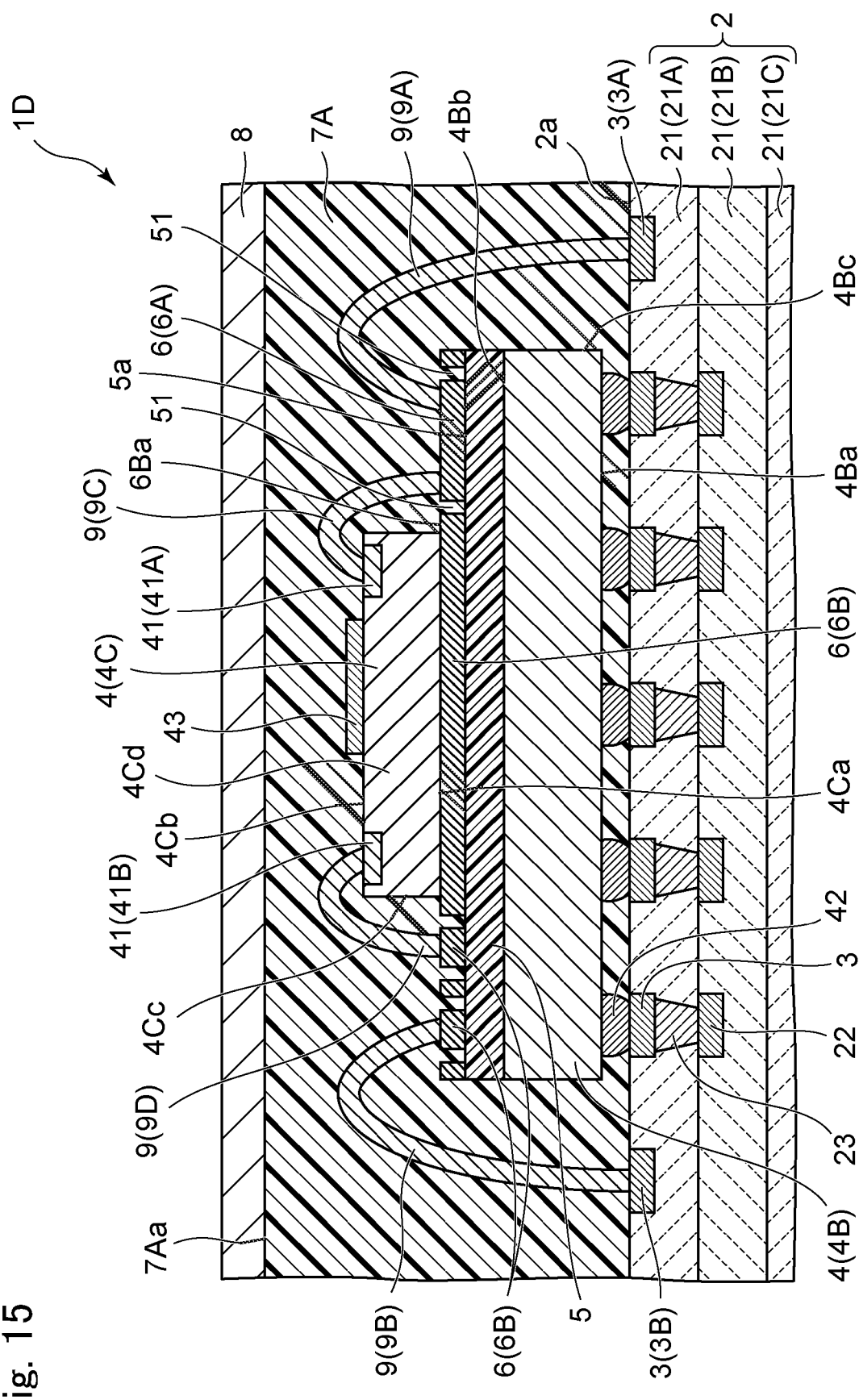
FIG. 15 is an enlarged view corresponding to the Z3 portion in FIG. 3 of the electronic circuit module according to the fifth embodiment of the present disclosure.

FIG. 14 is an enlarged view corresponding to the Z1 portion in FIG. 1 of an electronic circuit module according to a fifth embodiment of the present disclosure. FIG. 15 is an enlarged view corresponding to the Z3 portion in FIG. 3 of the electronic circuit module according to the fifth embodiment of the present disclosure. In FIG. 14 the sealing resin 7A and a portion of the shield member 8 in contact with the top surface 7Aa of the sealing resin 7A are omitted.

An electronic circuit module 1D according to the fifth embodiment is different from the electronic circuit module 1 according to the first embodiment in that the component electrode 41 is provided on the second surface 4Cb of the electronic component 4C.

A portion of the electronic circuit module 1D not illustrated in FIGS. 14 and 15, that is, a portion of the electronic circuit module 1D excluding a portion corresponding to the Z1 portion in FIG. 1 and a portion corresponding to the Z3 portion in FIG. 3 has the same configuration as the electronic circuit module 1.

As illustrated in FIGS. 14 and 15, in the fifth embodiment, the electronic components 4 include the electronic components 4A to 4C. In the present embodiment, the plurality of electronic components 4A (not illustrated), one electronic component 4B, and one electronic component 4C are provided.

In the present embodiment, the electronic components 4B and 4C constitute at least a part of the transmission circuit. The electronic component 4B operates in a higher frequency band than the electronic component 4C.

The pad electrodes 3 include the connection electrode 3A and the ground electrode 3B. In the present embodiment, as illustrated in FIG. 14, four connection electrodes 3A and two ground electrodes 3B are provided on the main surface 2a of the substrate 2.

The conductor 6 include the connecting portion 6A and the grounding portion 6B. In the present embodiment, four connecting portions 6A and one grounding portion 6B are provided. As illustrated in FIGS. 14 and 15, the connecting portion 6A is connected to the connection electrode 3A via the wire 9A. In the present embodiment, the connecting portion 6A is disposed outside the electronic component 4C when the electronic component 4B is viewed from a direction orthogonal to the second surface 4Bb. In the present embodiment, the grounding portion 6B is patterned in a region of the outer surface 5a of the resin sheet 5 excluding a portion where the connecting portion 6A is patterned and a peripheral portion 51 of the connecting portion 6A.

The grounding portion 6B is connected to the ground electrode 3B via the wire 9B. In the present embodiment, two ground electrodes 3B are connected to one grounding portion 6B via two wires 9B, respectively. As illustrated in FIG. 15, the grounding portion 6B includes an outer surface 6Ba which is opposite a surface facing the second surface 4Bb of the electronic component 4B.

The wires 9 include wires 9C and 9D in addition to the wires 9A and 9B. The wire 9C connects the connecting portion 6A to the component electrode 41A provided on the electronic component 4C. The wire 9D connects the grounding portion 6B to the component electrode 41B provided on the electronic component 4C. In the present embodiment, as illustrated in FIG. 14, four wires 9A, two wires 9B, four wires 9C, and two wires 9D are provided.

As illustrated in FIG. 15, the electronic component 4C is disposed on the outer surface 6Ba of the grounding portion 6B. Specifically, the first surface 4Ca of the electronic component 4C is in surface contact with the outer surface 6Ba of the grounding portion 6B. That is, the electronic component 4C is supported on the second surface 4Bb of the electronic component 4B via the grounding portion 6B and the resin sheet 5.

In the present embodiment, the conductive portion 43 is disposed in a portion of the second surface 4Cb of the electronic component 4C where the component electrode 41 is not disposed. Therefore, the conductive portion 43 is away from the second surface 4Bb of the electronic component 4B. In other words, in the electronic component 4C, the conductive portion 43 is disposed in a non-contact portion that is not in contact with the second surface 4Bb of the electronic component 4B.

The component electrodes 41 are provided on the second surface 4Cb of the electronic component 4C. The component electrodes 41 include component electrodes 41A and 41B. In the present embodiment, as illustrated in FIG. 14, four component electrodes 41A and two component electrodes 41B are provided.

As illustrated in FIG. 15, the component electrode 41A is connected to the connecting portion 6A via the wire 9C. The component electrode 41B is connected to the grounding portion 6B via the wire 9D. In the present embodiment, as illustrated in FIG. 14, two component electrodes 41B are connected to one grounding portion 6B via two wires 9D, respectively.

According to the fifth embodiment, the component electrodes 41A and 41B are disposed on the second surface 4Cb of the electronic component 4C. As a result, the first surface 4Ca of the electronic component 4C can be brought into surface contact with the outer surface 6Ba of the grounding portion 6B. Therefore, as compared with a configuration in which the electronic component 4C is supported on the second surface 4Bb of the electronic component 4B via the component electrodes 41A and 41B, displacement of the position and the posture of the electronic component 4C with respect to the electronic component 4B can be suppressed.

In the fifth embodiment, the first surface 4Ca of the electronic component 4C is in surface contact with the outer surface 6Ba of the grounding portion 6B, but the present disclosure is not limited thereto. For example, when the grounding portion 6B is not disposed between the electronic component 4B and the electronic component 4C, the first surface 4Ca of the electronic component 4C may be in surface contact with the outer surface 5a of the resin sheet 5. Further, when the resin sheet 5 is not provided, the first surface 4Ca of the electronic component 4C may be in surface contact with the second surface 4Bb of the electronic component 4B. Also in these cases, the above effect is exhibited.

Sixth Embodiment

Figure 16:
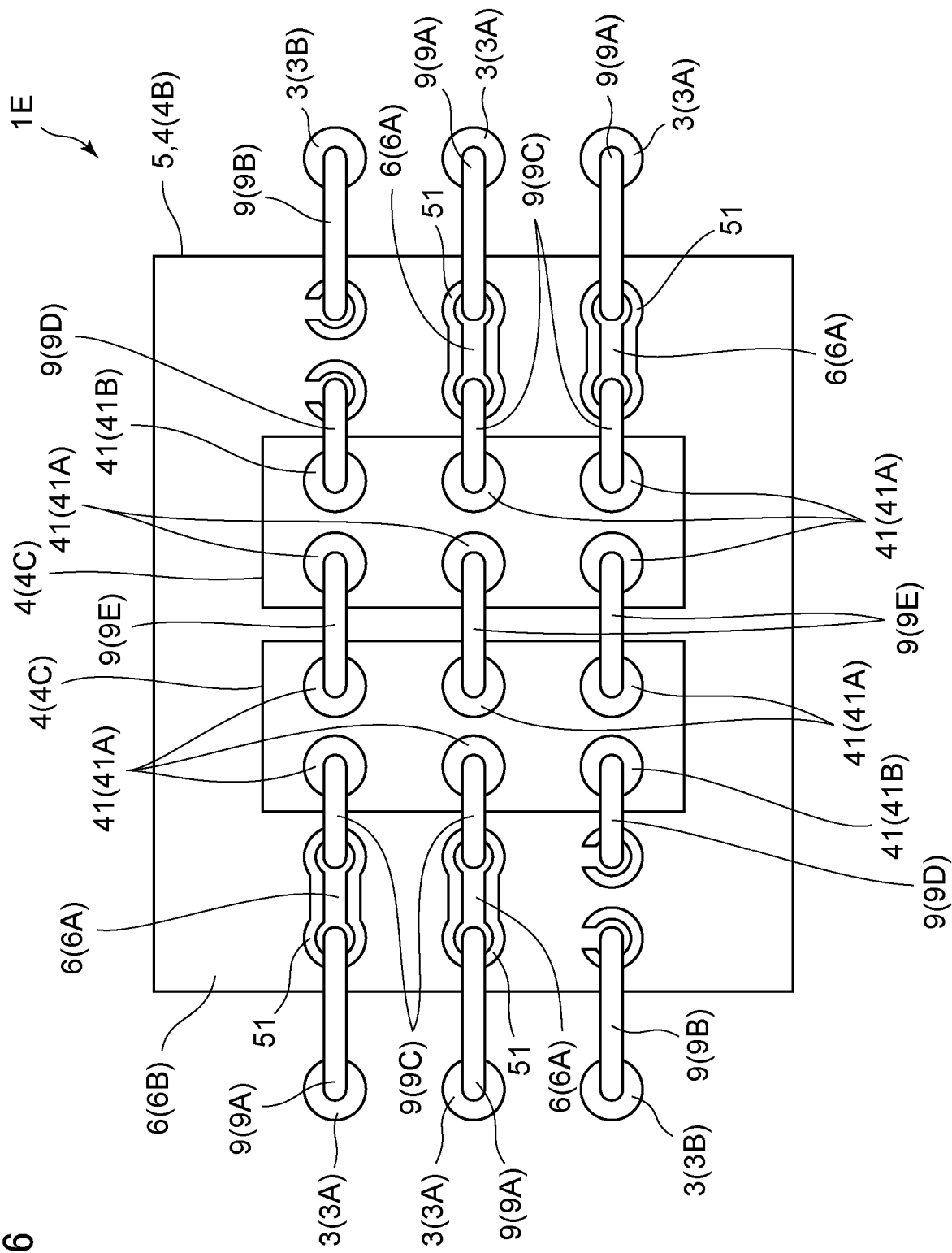
FIG. 16 is an enlarged view corresponding to the Z1 portion in FIG. 1 of an electronic circuit module according to a sixth embodiment of the present disclosure.
Figure 17:
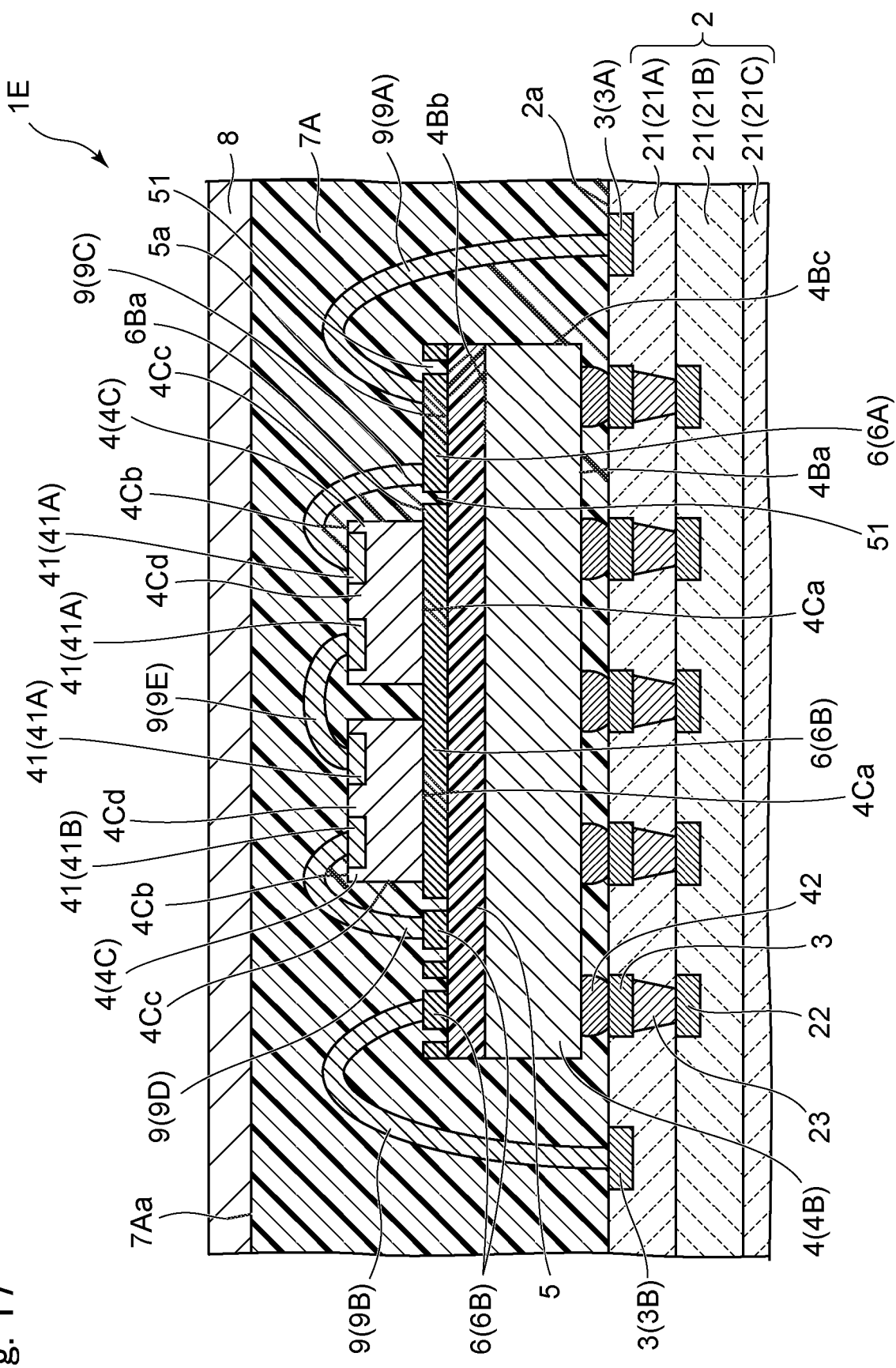
FIG. 17 is an enlarged view corresponding to the Z3 portion in FIG. 3 of the electronic circuit module according to the sixth embodiment of the present disclosure.

FIG. 16 is an enlarged view corresponding to the Z1 portion in FIG. 1 of an electronic circuit module according to a sixth embodiment of the present disclosure. FIG. 17 is an enlarged view corresponding to the Z3 portion in FIG. 3 of the electronic circuit module according to the sixth embodiment of the present disclosure. In FIG. 16 the sealing resin 7A and a portion of the shield member 8 in contact with the top surface 7Aa of the sealing resin 7A are omitted. In FIGS. 16 and 17, the conductive portion 43 is omitted.

An electronic circuit module 1E according to the sixth embodiment is different from the electronic circuit module 1D according to the fifth embodiment in that a plurality of the electronic components 4C are supported on the second surface 4Bb of the electronic component 4B.

A portion of the electronic circuit module 1E not illustrated in FIGS. 16 and 17, that is, a portion of the electronic circuit module 1E excluding a portion corresponding to the Z1 portion in FIG. 1 and a portion corresponding to the Z3 portion in FIG. 3 has the same configuration as the electronic circuit module 1.

As illustrated in FIGS. 16 and 17, in the sixth embodiment, the electronic components 4 include the electronic components 4A to 4C. In the present embodiment, the electronic component 4B constitutes at least a part of the transmission circuit. In the present embodiment, the electronic component 4C constitute at least a part of the transmission circuit. In the present embodiment, as the electronic component 4, the plurality of electronic components 4A (not illustrated), one electronic component 4B, and two electronic components 4C are provided.

As illustrated in FIG. 17, two electronic components 4C are supported on the second surface 4Bb of the electronic component 4B via the resin sheet 5 and the conductor 6. The first surface 4Ca of each of the electronic components 4C is in contact with the outer surface 6Ba of the grounding portion 6B.

The pad electrodes 3 include the connection electrode 3A and the ground electrode 3B. In the present embodiment, as illustrated in FIG. 16, four connection electrodes 3A and two ground electrodes 3B are provided on the main surface 2a of the substrate 2.

The conductors 6 include the connecting portions 6A and the grounding portion 6B. In the present embodiment, four connecting portions 6A and one grounding portion 6B are provided. In the present embodiment, the connecting portion 6A is disposed outside the electronic component 4C when the electronic component 4B is viewed from a direction orthogonal to the second surface 4Bb. Two ground electrodes 3B are connected to one grounding portion 6B via two wires 9B, respectively. In the present embodiment, the grounding portion 6B is patterned in a region of the outer surface 5a of the resin sheet 5 excluding a portion where the connecting portion 6A is patterned and a peripheral portion 51 of the connecting portion 6A.

The wires 9 include a wire 9E in addition to the wires 9A to 9D. In the present embodiment, four wires 9A, two wires 9B, four wires 9C, two wires 9D, and three wires 9E are provided.

As illustrated in FIG. 17, the wire 9E connects the component electrodes 41A to each other, each of the component electrodes 41A being provided on a respective one of the electronic components 4C different from each other. As a result, signal transmission, power supply, and the like between the plurality of electronic components 4C can be performed. The wire 9E may be electrically connected to the ground and may be grounded.

The component electrodes 41 are provided on the second surface 4Cb of the electronic component 4C. The component electrodes 41 include component electrodes 41A and 41B. In the present embodiment, five component electrodes 41A and one component electrode 41B are provided on each electronic component 4C.

In each electronic component 4C, two of the five component electrodes 41A are each connected to the connecting portion 6A via the wire 9A. The other three of the five component electrodes 41A are each connected to the component electrode 41A provided on the other electronic component 4C via the wire 9E.

Seventh Embodiment

Figure 18:
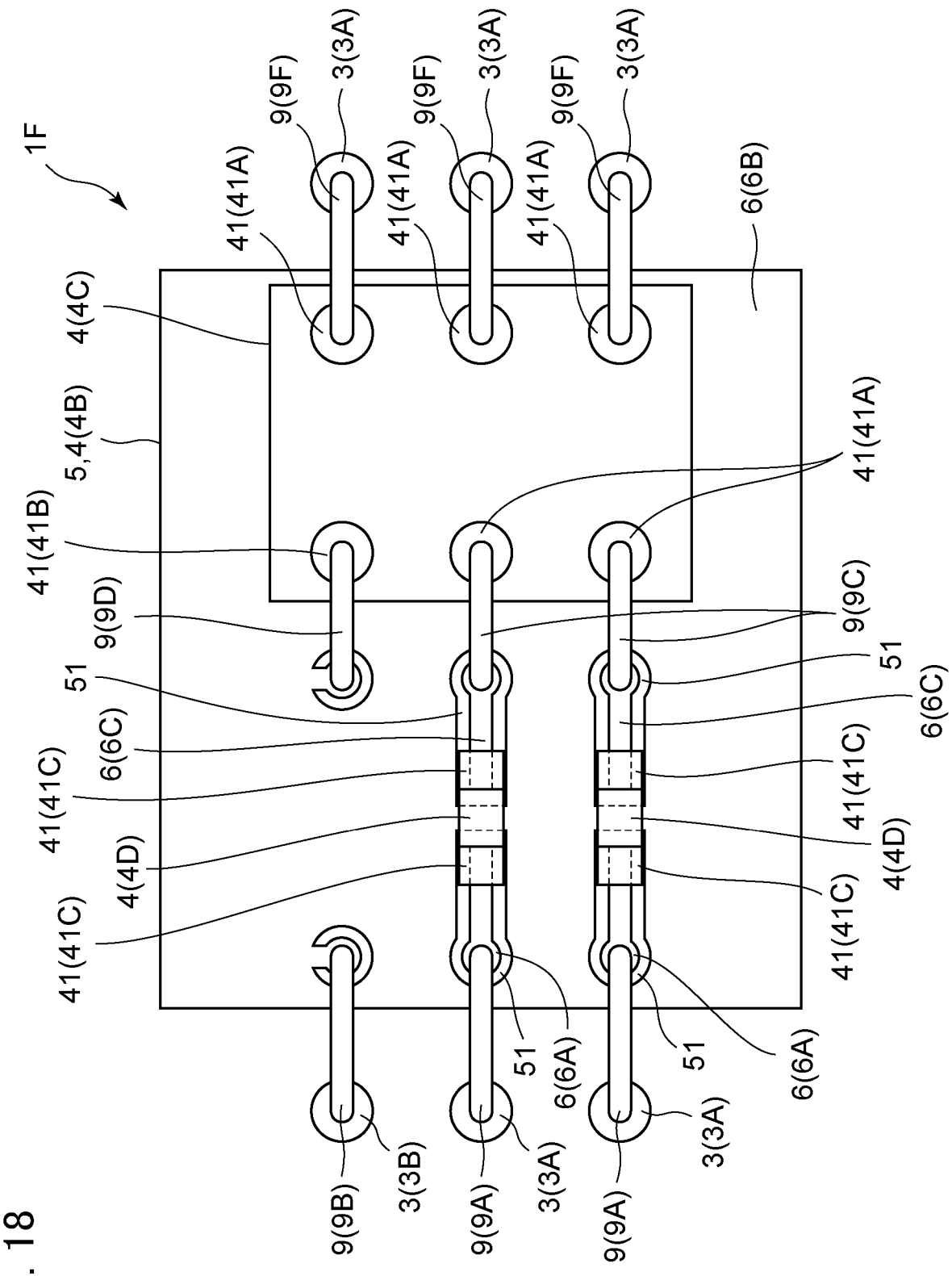
FIG. 18 is an enlarged view corresponding to the Z1 portion in FIG. 1 of an electronic circuit module according to a seventh embodiment of the present disclosure.
Figure 19:
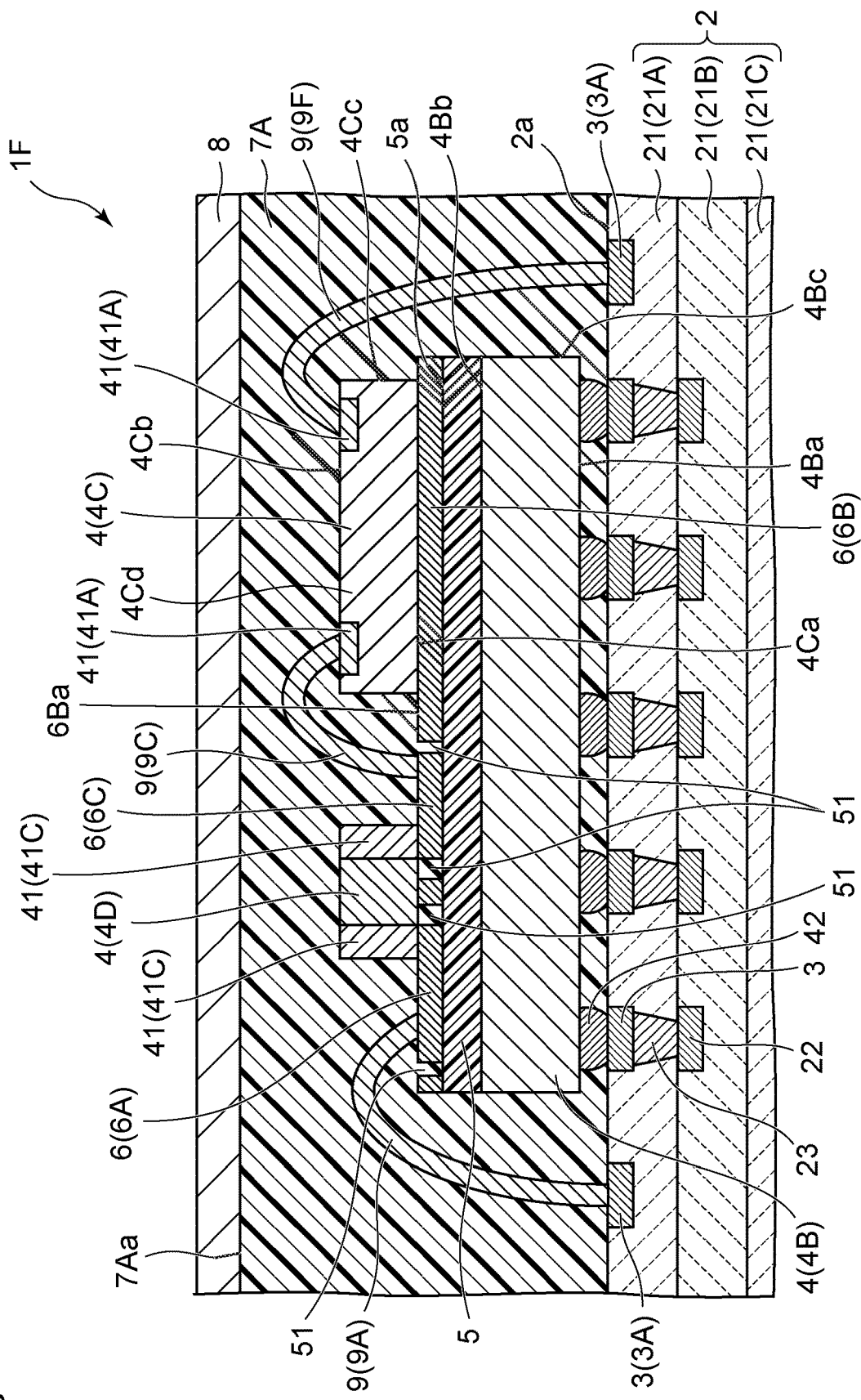
FIG. 19 is an enlarged view corresponding to the Z3 portion in FIG. 3 of the electronic circuit module according to the seventh embodiment of the present disclosure.

FIG. 18 is an enlarged view corresponding to the Z1 portion in FIG. 1 of an electronic circuit module according to a seventh embodiment of the present disclosure. FIG. 19 is an enlarged view corresponding to the Z3 portion in FIG. 3 of the electronic circuit module according to the seventh embodiment of the present disclosure. In FIG. 18 the sealing resin 7A and a portion of the shield member 8 in contact with the top surface 7Aa of the sealing resin 7A are omitted. In FIGS. 18 and 19, the conductive portion 43 is omitted.

An electronic circuit module 1F according to the seventh embodiment is different from the electronic circuit module 1A according to the second embodiment in that the component electrodes 41A and 41B are provided on the second surface 4Cb of the electronic component 4C. A wire 9F connecting the connection electrode 3A to the component electrode 41A provided on the electronic component 4C is provided. The electronic component 4E (see FIG. 7) is not provided in the electronic circuit module 1F.

A portion of the electronic circuit module 1F not illustrated in FIGS. 18 and 19, that is, a portion of the electronic circuit module 1F excluding a portion corresponding to the Z1 portion in FIG. 1 and a portion corresponding to the Z3 portion in FIG. 3 has the same configuration as the electronic circuit module 1.

As illustrated in FIGS. 18 and 19, in the seventh embodiment, the electronic components 4 include the electronic components 4A to 4D. In the present embodiment, the plurality of electronic components 4A (not illustrated), one electronic component 4B, one electronic component 4C, and two electronic components 4D are provided.

In the present embodiment, the electronic component 4B constitutes at least a part of the transmission circuit. The electronic component 4C constitutes at least a part of the reception circuit. The electronic component 4D constitutes at least a part of an impedance matching circuit.

The pad electrodes 3 include the connection electrode 3A and the ground electrode 3B. In the present embodiment, as illustrated in FIG. 18, five connection electrodes 3A and one ground electrode 3B are provided on the main surface 2a of the substrate 2.

The conductors 6 include the connecting portions 6A and 6C and the grounding portion 6B. As illustrated in FIG. 19, the connecting portion 6C is connected to the wire 9C and the component electrode 41C provided on the electronic component 4D. In the present embodiment, as illustrated in FIG. 18, two connecting portions 6A, one grounding portion 6B, and two connecting portions 6C are provided. One ground electrode 3B is connected to one grounding portion 6B via one wire 9B. In the present embodiment, the grounding portion 6B is patterned in a region of the outer surface 5a of the resin sheet 5 excluding a portion where the connecting portions 6A and 6C are patterned and the peripheral portions 51 of the connecting portions 6A and 6C.

The wires 9 include a wire 9F in addition to the wires 9A to 9D. The wire 9F connects the component electrode 41A provided on the second surface 4Cb of the electronic component 4C to the connection electrode 3A. In the present embodiment, two wires 9A, one wire 9B, two wires 9C, one wire 9D, and three wires 9F are provided.

As illustrated in FIG. 19, the electronic component 4C is supported on the second surface 4Bb of the electronic component 4B via the resin sheet 5 and the conductor 6. The first surface 4Ca of the electronic component 4C is in contact with the outer surface 6Ba of the grounding portion 6B.

As illustrated in FIG. 18, in the present embodiment, five component electrodes 41A and one component electrode 41B are provided on the second surface 4Cb of the electronic component 4C. Two of the five component electrodes 41A are connected to the connecting portions 6C via the wires 9C, respectively. The other three of the five component electrodes 41A are connected to the connection electrodes 3A via the wires 9F, respectively. As a result, the electronic component 4C is electrically connected to the connection electrode 3A without the conductor 6 interposed therebetween.

As illustrated in FIGS. 18 and 19, component electrodes 41C are provided at both end portions of the electronic component 4D, respectively. In each electronic component 4D, one component electrode 41C is electrically connected to the connecting portion 6A. The other component electrode 41C is electrically connected to the connecting portion 6C. In the present embodiment, each component electrode 41C is in contact with a respective one of the connecting portions 6A and 6C. That is, the electronic component 4D is supported on the second surface 4Bb of the electronic component 4B via the component electrode 41C.

Note that the present disclosure is not limited to the above-described embodiments, and can be implemented in various other aspects. In the first and second embodiments and the fifth to seventh embodiments, the electronic components 4 are mounted on the main surfaces 2a and 2b of the substrate 2, but the present disclosure is not limited thereto. For example, the electronic component 4 may be mounted only on the main surface 2a of the substrate 2.

In the first to seventh embodiments, the number of the insulating layers 21 is not limited to three, and may be one or more.

In the first to seventh embodiments, the number of the connection electrodes 3A may be one or more. The number of ground electrodes 3B may be one or more. The ground electrode 3B need not be provided on the substrate 2.

In the first and second embodiments and the fifth to seventh embodiments, the electronic components 4A need not be provided. In the third and fourth embodiments, at least one electronic component 4A may be provided on the main surface 2a of the substrate 2. In the first to seventh embodiments, two or more electronic components 4B may be provided on the substrate 2.

In the first to seventh embodiments, one or more connecting portions 6A may be provided. Two or more conductors 6 may be provided. The conductors 6 need not include the grounding portion 6B.

In the first to seventh embodiments, the resin sheet 5 covers the second surface 4Bb of the electronic component 4B, but the present disclosure is not limited thereto. The resin sheet 5 may cover only a part of the second surface 4Bb of the electronic component 4B. Further, the resin sheet 5 need not be provided. In this case, the conductor 6 may be, for example, a metal plate, a metal film, or the like.

In the first to seventh embodiments, the number of the component electrodes 41A and 41B may be one or more.

In the electronic component 4C, the conductive portion 43 may be disposed away from the second surface 4Bb of the electronic component 4B. In the first to fourth embodiments, the conductive portion 43 is disposed in a portion of the first surface 4Ca of the electronic component 4C where the component electrode 41 is not disposed, but the present disclosure is not limited thereto. For example, the conductive portion 43 may be disposed on the second surface 4Cb, the third surface 4Cc, and an inside 4Cd of the electronic component 4C. In the fifth to seventh embodiment, the conductive portion 43 is disposed in the portion of the second surface 4Cb of the electronic component 4C where the component electrode 41 is not disposed, but the present disclosure is not limited thereto. For example, the conductive portion 43 may be disposed on the third surface 4Cc and the inside 4Cd of the electronic component 4C.

In the first and second embodiments and the fifth to seventh embodiments, the sealing resin 7A covers the electronic component 4B and the wire 9, but the present disclosure is not limited thereto. For example, a part of the electronic component 4B and a part of the wire 9 may be exposed from the sealing resin 7A.

In the third to fifth embodiments, the sealing resin 7A covers the electronic component 4A, but the present disclosure is not limited thereto. For example, the sealing resin 7A may cover only one of the plurality of electronic components 4A. For example, the sealing resin 7A may cover only a part of the surface of the sealing resin 7A.

In the first and second embodiments and the fifth to seventh embodiments embodiment, the shield member 8 is disposed across the top surface 7Aa and the side surface 7Ab of the sealing resin 7A and the side surface 7Bb of the sealing resin 7B, but the present disclosure is not limited thereto. For example, the shield member 8 may be disposed in a region of the top surface 7Ba of the sealing resin 7B excluding a portion where the columnar electrode 24 is exposed. In the first and second embodiments and the fifth to seventh embodiments, the shield member 8 need not be provided.

In the third to fifth embodiments, the shield member 8 may be disposed so as to cover at least the top surface 7Aa of the sealing resin 7A.

In the third and fourth embodiments, the component electrode 41C corresponds to the external electrode in the present disclosure, but the present disclosure is not limited thereto. For example, an external electrode different from the component electrode 41C may be provided on the electronic component 4D. An external electrode different from the component electrodes 41A and 41B may be provided on the electronic component 4C.

In the fifth to seventh embodiments, the component electrodes 41A and 41B are provided on the second surface 4Cb of the electronic component 4C, but the present disclosure is not limited thereto. The component electrodes 41A and 41B may be formed on a surface of the electronic component 4C other than the first surface 4Ca facing the second surface 4Bb of the electronic component 4B. For example, the component electrodes 41A and 41B may be provided on the third surface 4Cc of the electronic component 4C, or may be provided on the second surface 4Cb and the third surface 4Cc of the electronic component 4C.

In the seventh embodiment, the wire 9F connects the component electrode 41A and the connection electrode 3A to each other, but the present disclosure is not limited thereto. The wire 9F may connect the component electrode 41 provided on the electronic component 4C to the pad electrode 3 provided on the substrate 2. For example, the wire 9F may connect the component electrode 41B provided on the electronic component 4C to the ground electrode 3B.

Note that by appropriately combining any embodiments from the above-described various embodiments, the effects of the respective embodiments can be achieved.

Although the present disclosure has been fully described in connection with preferred embodiments with reference to the accompanying drawings, various variations and modifications will be apparent to those skilled in the art. Such variations and modifications should be understood to be included within the scope of the present disclosure according to the appended claims as long as they do not depart therefrom.

According to an electronic circuit module of the present disclosure, a displacement of a position and a posture of a second electronic component is suppressed, and thus it is useful for an electronic circuit module in which two electronic components are disposed so as to overlap each other in the thickness direction of the substrate.

1, 1A-1F electronic circuit module
2 substrate
2a, 2b main surface
3 pad electrode
3A connection electrode
3B ground electrode
4, 4A-4E electronic component
4Bb second surface
4Cd inside
41, 41A-41C component electrode
42 solder bump
43 conductive portion
6 conductor
6A connecting portion
6B grounding portion
6C connecting portion
7A, 7B sealing resin
7Aa, 7Ba top surface
7Ab, 7Bb side surface
71 through hole
8 shield member
9, 9A-9F wire

The invention claimed is:
1. An electronic circuit module comprising:
a substrate;
a first electronic component mounted on one main surface of the substrate;
a substrate electrode provided on the one main surface;
a second electronic component supported on a support surface opposite to a surface facing the one main surface of the first electronic component;
a conductor provided on the support surface of the first electronic component;
a wire connected to the conductor and the substrate electrode;
a component electrode provided on a surface of the second electronic component and electrically connected to the conductor; and a first sealing resin provided on the one main surface and covering at least a part of the first electronic component, at least a part of the wire, and a part of the second electronic component, wherein the second electronic component is supported on the support surface of the first electronic component via the component electrode, the component electrode is connected to the conductor, the second electronic component includes an external electrode disposed on a surface opposite to a surface facing the support surface of the first electronic component, and at least a part of the external electrode is exposed to an outside.

2. The electronic circuit module according to claim 1, wherein a through hole configured to cause the external electrode to communicate with the outside of the electronic circuit module is provided in the first sealing resin.

3. The electronic circuit module according to claim 1, wherein the substrate comprises an other main surface opposite to the one main surface, and the electronic circuit module further comprises:

a third electronic component mounted on the other main surface;

a second sealing resin provided on the other main surface and covering at least a part of the third electronic component mounted on the other main surface; and a shield member covering a surface of the second sealing resin provided on the other main surface, the surface being opposite to a surface in contact with the other main surface.

4. The electronic circuit module according to claim 1, wherein the component electrode is disposed on a surface of the second electronic component other than a surface facing the support surface of the first electronic component, and the wire includes a first wire connected to the conductor and the substrate electrode, and a second wire connected to the conductor and the component electrode.

5. The electronic circuit module according to claim 1, wherein the wire and the conductor are electrically connected to a ground to shield an electromagnetic wave.

6. The electronic circuit module according to claim 5, further comprising a fourth electronic component disposed at a position between the first electronic component and the substrate electrode on the one main surface when the substrate is viewed from a direction orthogonal to the one main surface, wherein the wire overlaps the fourth electronic component when the substrate is viewed from the direction orthogonal to the one main surface.

7. The electronic circuit module according to claim 5, wherein the conductor overlaps at least a part of the second electronic component when viewed from a direction orthogonal to the support surface of the first electronic component.

8. The electronic circuit module according to claim 5, wherein the first electronic component constitutes at least a part of a transmission circuit.

9. The electronic circuit module according to claim 8, wherein the first electronic component is a power amplifier, a surface acoustic wave filter, or a bulk acoustic wave filter.

10. The electronic circuit module according to claim 8, wherein the second electronic component constitutes at least a part of a transmission circuit, and the first electronic component operates in a higher frequency band than the second electronic component.

11. The electronic circuit module according to claim 8, wherein the second electronic component constitutes at least a part of a reception circuit.

12. The electronic circuit module according to claim 1, further comprising a resin sheet disposed on the support surface of the first electronic component, wherein at least a part of the conductor is patterned on a surface of the resin sheet opposite to a surface facing the first electronic component.

13. The electronic circuit module according to claim 1, wherein at least a part of the conductor is in contact with the surface of the first electronic component.

14. The electronic circuit module according to claim 1, wherein the second electronic component comprises a conductive portion electrically connected to the component electrode, and the conductive portion is away from the support surface of the first electronic component.

15. The electronic circuit module according to claim 1, wherein the first electronic component is connected to the substrate electrode via a conductive member.

16. The electronic circuit module according to claim 2, wherein the substrate comprises an other main surface opposite to the one main surface, and the electronic circuit module further comprises:

a third electronic component mounted on the other main surface;

a second sealing resin provided on the other main surface and covering at least a part of the third electronic component mounted on the other main surface; and a shield member covering a surface of the second sealing resin provided on the other main surface, the surface being opposite to a surface in contact with the other main surface.

17. The electronic circuit module according to claim 2, wherein the wire and the conductor are electrically connected to a ground to shield an electromagnetic wave.

18. The electronic circuit module according to claim 3, wherein the wire and the conductor are electrically connected to a ground to shield an electromagnetic wave.

19. The electronic circuit module according to claim 4, wherein the wire and the conductor are electrically connected to a ground to shield an electromagnetic wave.

20. The electronic circuit module according to claim 6, wherein the conductor overlaps at least a part of the second electronic component when viewed from a direction orthogonal to the support surface of the first electronic component.

* * * * *